(12) United States Patent
Zheng et al.

(10) Patent No.: US 12,328,968 B1
(45) Date of Patent: Jun. 10, 2025

(54) BACK-CONTACT SOLAR CELL, METHOD FOR PREPARING THE SAME, AND PHOTOVOLTAIC MODULE

(71) Applicant: JINKO SOLAR (HAINING) CO., LTD., Haining (CN)

(72) Inventors: Jingjing Zheng, Haining (CN); Hui Liao, Haining (CN); Menglei Xu, Haining (CN); Jie Yang, Haining (CN); Xinyu Zhang, Haining (CN)

(73) Assignee: JINKO SOLAR (HAINING) CO., LTD., Zhejiang (CN)

( * ) Notice: Subject to any disclaimer, the term of this patent is extended or adjusted under 35 U.S.C. 154(b) by 0 days.

(21) Appl. No.: 18/614,488

(22) Filed: Mar. 22, 2024

(30) Foreign Application Priority Data

Dec. 12, 2023 (CN) .......................... 202311706460.1

(51) Int. Cl.
*H10F 77/20* (2025.01)
*H10F 19/90* (2025.01)

(52) U.S. Cl.
CPC ......... *H10F 77/219* (2025.01); *H10F 19/908* (2025.01); *H10F 77/215* (2025.01)

(58) Field of Classification Search
CPC ............. H01L 31/0288; H01L 31/0256; H01L 31/022425; H01L 31/022433; H01L 31/022441; H01L 31/0201; H01L 31/0352; H01L 31/035281; H10F 77/219;
(Continued)

(56) References Cited

U.S. PATENT DOCUMENTS

2005/0016585 A1* 1/2005 Munzer ............... H01L 31/1804
438/57
2013/0244371 A1* 9/2013 Sewell ................ H01L 31/0488
438/96
(Continued)

FOREIGN PATENT DOCUMENTS

CN 206098403 U 4/2017
CN 108807515 A 11/2018
(Continued)

OTHER PUBLICATIONS

English machine translation of Fan et al. (CN 114784142) published Jul. 22, 2022.*
(Continued)

*Primary Examiner* — Christina Chern
(74) *Attorney, Agent, or Firm* — USCH Law, PC

(57) ABSTRACT

Provided are a back-contact solar cell, a method for preparing the same, and a photovoltaic module. The solar cell includes a substrate, a plurality of first doped sections and a plurality of second doped sections. The substrate has a first side, and the first side has two opposing first edges perpendicular to a first direction and two opposing second edges perpendicular a second direction, the first direction being perpendicular to the second direction. The plurality of first doped sections are formed on the first side, and each first doped section includes a first portion extending along the second direction and a plurality of second portions distributed at intervals along the second direction, where each second portion protrudes from the first portion in a direction parallel to the second edges.

18 Claims, 8 Drawing Sheets

(58) Field of Classification Search
CPC ...... H10F 77/215; H10F 19/904; H10F 19/90;
H10F 19/902; H10F 19/908
See application file for complete search history.

(56) References Cited

U.S. PATENT DOCUMENTS

2014/0190549 A1* 7/2014 Haga ..................... H10F 19/904
136/244
2014/0352770 A1 12/2014 Hwang et al.
2015/0013742 A1* 1/2015 Lin ................. H01L 31/022441
136/244

FOREIGN PATENT DOCUMENTS

| CN | 111477702 | A | 7/2020 | | |
|---|---|---|---|---|---|
| CN | 214313221 | U | 9/2021 | | |
| CN | 113964216 | A | 1/2022 | | |
| CN | 114784142 | A | * 7/2022 | ......... | H01L 31/0682 |
| EP | 4391084 | A1 | * 6/2024 | ....... | H01L 31/02167 |
| KR | 20180136703 | A | 12/2018 | | |
| WO | 2023045347 | A1 | 3/2023 | | |
| WO | 2023050824 | A1 | 4/2023 | | |
| WO | 2023202132 | A1 | 10/2023 | | |

OTHER PUBLICATIONS

Jinko Solar (Haining) Co., Ltd., CN First Office Action with English Translation, CN 202311706460.1, Jan. 25, 2024, 18 pgs.
Jinko Solar (Haining) Co., Ltd., CN Second Office Action with English Translation, CN 202311706460.1, Feb. 21, 2024, 19 pgs.
Jinko Solar (Shangrao) Co., Ltd., et al., CN Notification of grant of patent right for invention, CN 202311706460.1, May 27, 2024, 6 pgs.
Jinko Solar (Haining) Co., Ltd., Extended European Search Report, EP 24165977.0, Sep. 13, 2024, 70 pgs.

* cited by examiner

BACK-CONTACT SOLAR CELL, METHOD FOR PREPARING THE SAME, AND PHOTOVOLTAIC MODULE

CROSS REFERENCE TO RELATED APPLICATIONS

The present application claims the benefit of priority under the Paris Convention to Chinese Patent Application No. CN202311706460.1, filed on Dec. 12, 2023, which is incorporated herein by reference in its entirety.

TECHNICAL FIELD

Embodiments of the present disclosure relate to the technical field of solar cells, and in particular, relate to a back-contact solar cell, a method for preparing the same, and a photovoltaic module.

BACKGROUND

Solar cells have good photoelectric conversion capabilities. A back-contact cell is a newly-structured cell with a front surface having no electrode shielding, and with P-type regions (hereinafter referred to as P regions) and N-type regions (hereinafter referred to as N regions) alternatingly arranged on a back surface thereof.

One category of the P regions and the N regions forms PN junctions with a substrate, and generates corresponding electron-hole pairs; and the other category of the P regions and the N regions forms high-low junctions with the substrate. The number of electron-hole pairs exerts a large impact on the magnitude of photocurrent generated by the back-contact solar cell, thereby affecting the photoelectric conversion performance of the back-contact solar cell. The high-low junction forms a built-in electric field directed to the interior of the substrate, reducing the recombination rate of carriers at the interface of the substrate and improving the photoelectric conversion efficiency of the back-contact solar cell. Therefore, the distribution of the PN and high-low junctions on the surface of the substrate is very important.

Based on this, in the existing back-contact solar cell, the arrangement of the P and N regions needs to be further designed to improve the photoelectric conversion performance of the back-contact solar cell.

SUMMARY

Embodiments of the present disclosure provide a back-contact solar cell, a method for preparing a back-contact solar cell and a photovoltaic module, which at least facilitates improving the photoelectric conversion efficiency of the back-contact solar cell.

The embodiments of the present disclosure provide a back-contact solar cell. The back-contact solar cell includes a substrate and a doped layer. The substrate has a first side, and the first side has two opposing first edges perpendicular to a first direction and two opposing second edges perpendicular a second direction, the first direction being perpendicular to the second direction. The doped layer is formed on the first side and includes a plurality of first doped sections and a plurality of second doped sections. Each respective first doped section of the plurality of first doped sections includes a first portion extending along the second direction and a plurality of second portions distributed at intervals along the second direction, and each of the plurality of second portions protrudes from the first portion in a direction parallel to the second edges. Each respective second doped section of the second doped sections includes a third portion extending along the second direction and a plurality of fourth portions distributed at intervals along the second direction, and each of the fourth portions protrudes from the third portion in the direction parallel to the second edges. The respective second doped section having a conductivity type different from a conductivity type of the respective first doped section. The plurality of first doped sections and the plurality of second doped sections are alternatingly arranged in the first direction, and the plurality of first doped sections include an outermost first doped section having its first portion bordering one of the two first edges. The plurality of second portions of the respective first doped region and fourth portions of a second doped region next to the respective first doped region are alternatingly arranged along the second direction. The plurality of second portions of the respective first doped section include an outermost second portion bordering one of the two second edges, another outermost second portion bordering the other one of the two second edges, and one or more other second portions between the two outermost second portions.

In some embodiments, a number of the plurality of first doped sections is equal to a number of the plurality of second doped sections, and the plurality of second doped sections include an outermost second doped section having its third portion bordering the other one of the two first edges.

In some embodiments, a number of the plurality of first doped sections is larger than a number of the plurality of second doped sections, and the plurality of first doped sections include another outermost first doped section having its first portion bordering the other one of the two first edges.

In some embodiments, each of a width of the outermost second portion bordering the one of the two second edges and a width of the another outermost second portion bordering the other one of the two second edges differs by a first difference from a width of any of the one or more other second portions between the two outermost second portions. Additionally and/or alternatively, the plurality of first doped sections include first doped sections having their first portions not bordering the two first edges, and a width of the first portion bordering the one of the two first edges is larger than a width of any of the first portions not bordering the two first edges. Additionally and/or alternatively, the plurality of second doped sections include second doped sections having their third portions not bordering the two first edges, and a width of the third portion bordering the other one of the two first edges is larger than that of any of the third portions not bordering the two first edges.

In some embodiments, the first difference is in a range of 0 to 50 μm, a difference between the width of the first portion bordering the one of the two first edges is larger than the width of any of the first portions not bordering the two first edges is in a range of 50 μm to 200 μm, and a difference between the width of the third portion bordering the other one of the two first edges is larger than that of any of the third portions not bordering the two first edges is in the range of 50 μm to 200 μm.

In some embodiments, the plurality of first doped sections are distributed at intervals from the plurality of second doped sections, and the back-contact solar cell further includes isolation structures. A respective isolation structure of the isolation structures is abutted on one side by a respective first doped section of the plurality of first doped sections and on an opposing side by a respective second doped section of the plurality of second doped sections.

In some embodiments, the back-contact solar cell further includes a first passivation layer formed over a surface of the respective first doped section facing away from the substrate and a surface of the respective second doped section facing away from the substrate. The first passivation layer is configured to fill a gap between the respective first doped section and the respective second doped section, and a portion of the first passivation layer between the respective first doped section and the respective second doped section serves as the respective isolation structure.

In some embodiments, the back-contact solar cell further includes a plurality of first grids and a plurality of second grids. Each respective first grid of the plurality of first grids includes a first busbar, and a plurality of first fingers distributed at intervals along the second direction. The first busbar extends along the second direction, an orthographic projection of the first busbar on the substrate is in a surface of the first portion, and an orthographic projection of a respective first finger of the plurality of first fingers on the substrate is in a surface of a respective second portion of the plurality of second portions. Each respective second grid of the plurality of second grids includes a second busbar, and a plurality of second fingers distributed at intervals along the second direction. The second busbar extends along the second direction, an orthographic projection of the second busbar on the substrate is in a surface of the third portion, and an orthographic projection of a respective second finger of the plurality of second fingers on the substrate is in a surface of a respective fourth portion of the plurality of fourth portions.

In some embodiments, along the second direction, a width of the first portion is larger than a width of the first busbar, and a width of the third portion is larger than a width of the second busbar.

In some embodiments, two ends, along the second direction, of the third portion are respectively coincident with the two second edges.

The embodiments of the present disclosure further provide a photovoltaic module. The photovoltaic module includes at least one cell string, an encapsulation layer and a cover plate. Each of the at least one cell string is formed by connecting the back-contact solar cells as described above. The encapsulation layer is configured to cover a surface of the at least one cell string. The cover plate is configured to cover a surface of the encapsulation layer away from the at least one cell string.

The embodiments of the present disclosure further provide a method for preparing a back-contact solar cell. The method includes: providing a substrate, wherein the substrate has a first side, the first side having two first edges opposite to each other along a first direction and two second edges opposite to each other along a second direction, the first direction being perpendicular to the second direction; forming a doped layer on the first side, including: forming a plurality of first doped sections, each respective first doped section of the plurality of first doped sections including a first portion extending along the second direction and a plurality of second portions distributed at intervals along the second direction, each of the plurality of second portions extending along the first direction and being intersected with the first portion; and forming a plurality of second doped sections, each respective second doped section of the second doped sections including a third portion extending along the second direction and a plurality of fourth portions distributed at intervals along the second direction, each of the fourth portions extending along the first direction and being intersected with the third portion, the respective second doped section having a conductivity type different from a conductivity type of the respective first doped section, where first portions and third portions are alternatingly arranged along the first direction, and among the alternatingly arranged first portions and third portions, a first portion disposed on an outermost side is arranged at a respective first edge of the two first edges; where in a first doped section and a second doped section adjacent to each other, second portions and fourth portions are alternatingly arranged along the second direction; and in the respective first doped section, two second portions of the plurality of second portions disposed on an outermost side are respectively arranged on the two second edges.

In some embodiments, forming the plurality of first doped sections includes: providing an initial substrate, where the initial substrate is doped with a first doping element; implanting a second doping element to an interior of the initial substrate from a surface of the initial substrate by a doping process, to transform a portion of a thickness of the initial substrate into an initial doped section, wherein a remaining portion of the initial substrate serves as the substrate, and the second doping element has a conductivity type different from a conductivity type of the second doping element; and subjecting the initial first doped section to a first patterning process, to form the plurality of first doped sections having predetermined patterns.

In some embodiments, the first patterning process includes: removing portions of the initial first doped section by etching in a laser process to form first openings, where remaining portions of the initial first doped section form the plurality of first doped sections.

In some embodiments, in the doping process, a first glass layer is formed on a surface of the initial first doped section, and after the first patterning process, portions of the first glass layer over surfaces of the plurality of first doped sections are reserved, and forming the plurality of second doped sections includes: forming an initial second doped section by filling the first openings, wherein the initial second doped section is doped with a third doping element, the third doping element having a conductivity type different from a conductivity type of the second doping element; forming a mask layer over a surface of the initial second doped section, wherein the mask layer has second openings exposing portions of the initial second doped section; and etching, with the first glass layer and the mask layer as a mask, the initial second doped section along the second openings to expose portions of the substrate aligned with the second openings, remaining portions of the initial second doped section forming the plurality of second doped sections.

BRIEF DESCRIPTION OF THE DRAWINGS

One or more embodiments are described by way of example with reference to the corresponding figures in the accompanying drawings, and the exemplary description is not to be construed as limiting the embodiments. Unless otherwise particularly stated, the figures in the accompanying drawings are not drawn to scale.

DETAILED DESCRIPTION OF THE EMBODIMENTS

Figure 1:
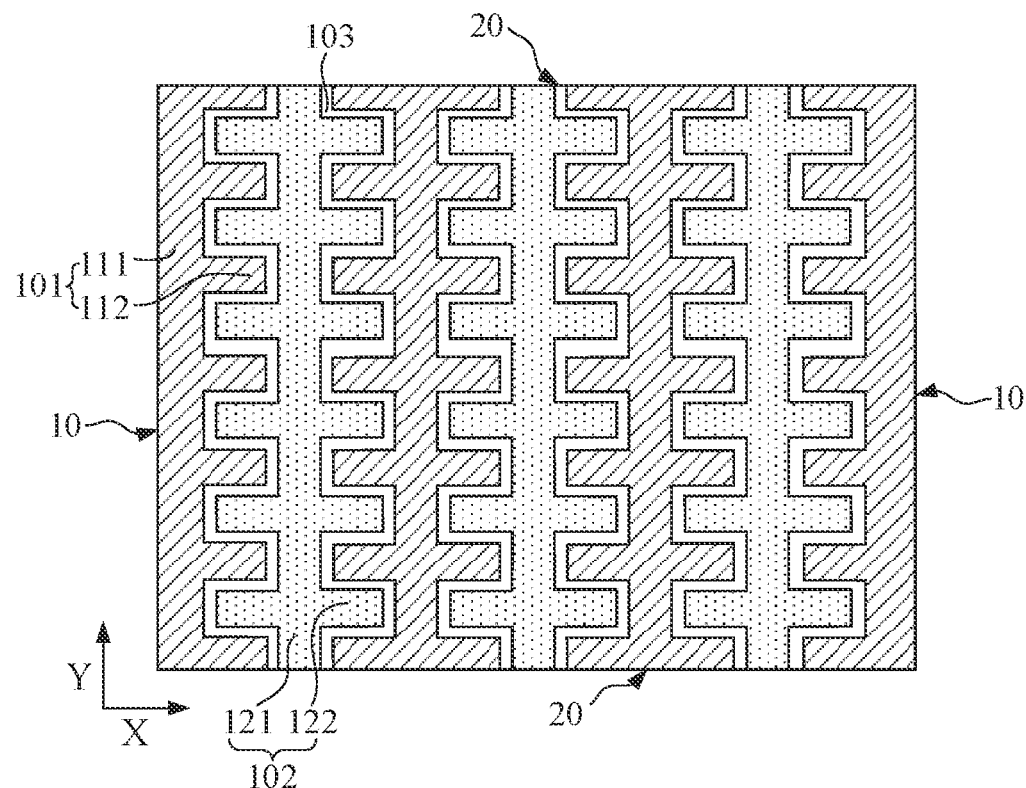
FIG. 1 is a schematic top view of a back-contact solar cell according to some embodiments of the present disclosure.

As used herein, features (e.g., regions, structures, or devices) described as being "adjacent" to each other mean and include features having one or more of the disclosed identifiers that are positioned closest (e.g., nearest) to each other. One or more of the disclosed identified additional features (e.g., additional regions, additional structures, additional devices) that do not match "adjacent" features may be disposed between the "adjacent" features. In other words, "adjacent" features may be defined as being directly adjacent to each other such that no other features intervene between the "adjacent" features. Alternatively, "adjacent" features may be defined as being in indirect proximity to each other such that at least one feature having an identity other than the identity associated with the at least one "adjacent" feature is positioned between the "adjacent" features. Thus, features described as being "vertically adjacent" to each other are intended to mean and encompass one or more of the identified disclosed features that are vertically closest (e.g., vertically closest) to each other. Further, features described as being "horizontally adjacent" to each other are intended to mean and include one or more of the disclosed identified features that are located at the closest (e.g., nearest) level to each other.

In the description hereinafter, a second member is formed or arranged over or on a first member, or a second member is formed or arranged on a surface of a first member, or a second member is formed or arranged on a side of a first member. Such description covers an embodiment where the first member is in direct contact with the second member, or may cover an embodiment where an additional member is arranged between the first member and the second member, such that the first member may not be in direct contact with the second member. Various members may be arbitrarily drawn to scale for simplicity and clarity. In the drawings, some of the layers/members may be omitted for simplicity.

Unless otherwise specified, the description that the second member is formed or arranged on the surface of the first member means that the first member is in direct contact with the second member.

Herein, the "member" may refer to a layer, a film, a region, a part, a structure, or the like.

It is known from the background art that the photoelectric conversion performance of existing back-contact solar cells needs to be further improved.

It is found that one of the reasons why the photoelectric conversion performance of the existing solar cell needs to be further improved is that, in the existing back-contact solar cell, there is no specific limitation on the arrangement of P regions and N regions, resulting in less area occupied by the P regions or the N regions disposed on the substrate surface, which is not conducive to increasing the open-circuit voltage. As a result, the photoelectric conversion efficiency of the back-contact solar cell is poor.

Embodiments of the present disclosure provide a back-contact solar cell, where first doped sections and second doped sections of different conductivity types are alternatingly arranged in a first surface, and two second edges and at least one first edge of the first surface all include first doped sections, so that the edges of the first surface can be utilized to a greatest extent to arrange as many first doped sections as possible in the first surface. Furthermore, by utilizing the edge position of the first surface, the available area of the first surface is increased, so that a higher number of second doped sections can be arranged at non-edge positions. In this way, the number of electron-hole pairs is increased, and the recombination rate of carriers at the interface of the substrate is further reduced, so that the photoelectric conversion efficiency of the back-contact solar cell is comprehensively improved.

The embodiments of the present disclosure are described in detail with reference to the accompanying drawings. However, persons of ordinary skill in the art may understand, in the embodiments of the present disclosure, more technical details are provided for readers to better understand the present disclosure. However, even without these technical details and various variations and modifications based on the following embodiments, the technical solutions of the present disclosure may also be realized.

Figure 2:
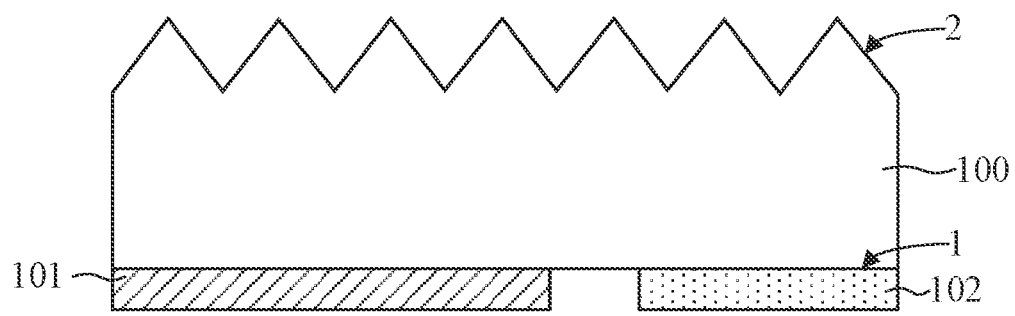
FIG. 2 is a schematic sectional view of a first back-contact solar cell according to some embodiments of the present disclosure.
Figure 3:
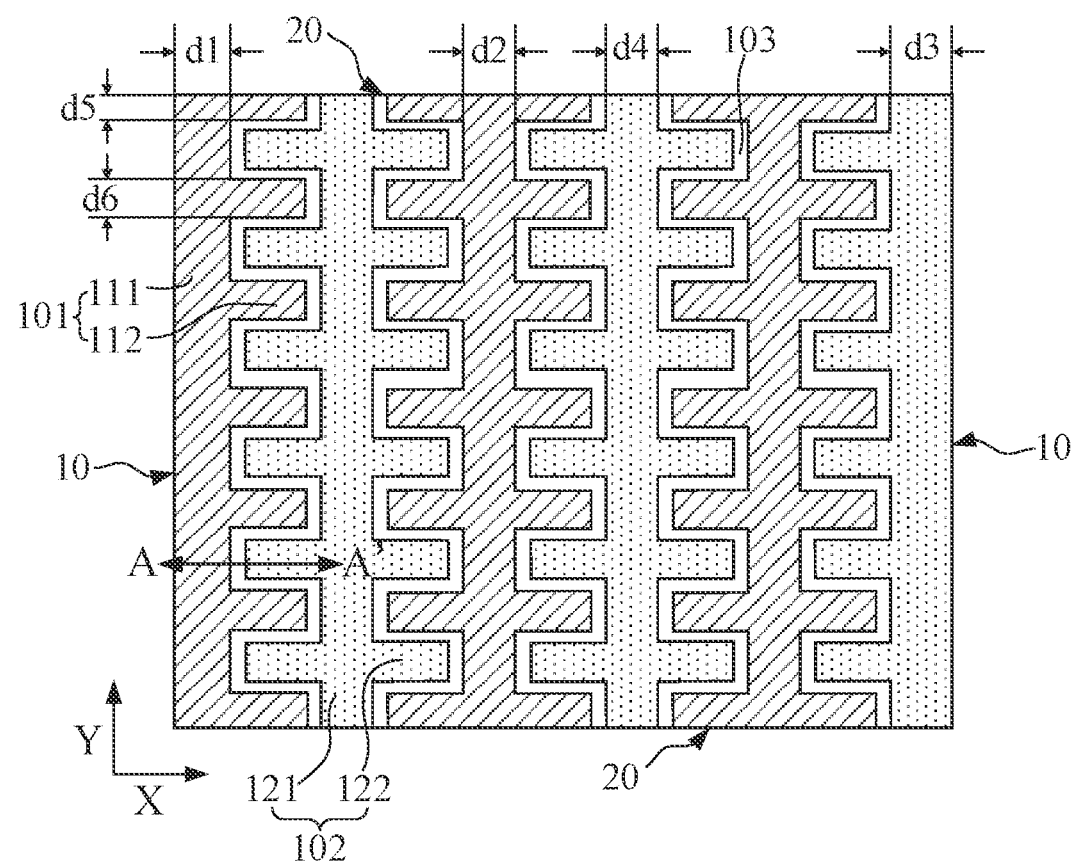
FIG. 3 is a schematic top view of another back-contact solar cell according to some embodiments of the present disclosure.

FIG. 1 is a schematic top view of a back-contact solar cell according to some embodiments of the present disclosure. FIG. 2 is a schematic sectional view of a first back-contact solar cell according to some embodiments of the present disclosure. FIG. 3 is a schematic top view of another back-contact solar cell according to some embodiments of the present disclosure. FIG. 2 is a schematic sectional view taken along an AA' direction of the back-contact solar cell in FIG. 3.

Referring to FIG. 1 to FIG. 3, the back-contact solar cell includes a substrate 100 having a first surface 1, and a doped layer located on the first surface 1. The first surface 1 has two first edges 10 opposite to each other along a first direction X, and two second edges 20 opposite to each other along a second direction Y. That is, the first surface 1 has two opposing first edges 10 perpendicular to the first direction X and two opposing second edges 20 perpendicular the second direction Y. The first direction X is perpendicular to the second direction Y. The back-contact solar cell further includes: a plurality of first doped sections 101 formed over the first surface 1. Each respective first doped section 10 of the plurality of first doped sections 101 includes a first portion 111 extending along the second direction Y, and a plurality of second portions 112 distributed at intervals along the second direction Y. Each of the plurality of second portions 112 extends along the first direction X, and is intersected with the first portion 111. That is, each of the plurality of second portions 112 protrudes from the first portion 111 in the first direction X. The back-contact solar cell further includes a plurality of second doped sections 102 formed over the first surface. Each respective second doped section 102 of the plurality of second doped sections 102 includes a third portion 121 extending along the second direction Y, and a plurality of fourth portions 122 distributed at intervals along the second direction Y. Each of the plurality of fourth portions 122 extends along the first direction X, and is intersected with the third portion 121. That is, each of the fourth portions 122 protrudes from the third portion in the first direction X. The respective second doped section 102 has a conductivity type different from a conductivity type of the respective first doped sections 101. First portions 111 and third portions 121 are alternatingly arranged the first direction X. Among the alternatingly arranged first portions 111 and third portions 121, a first portion 111 disposed on an outermost side is arranged on a respective first edge 10 of the two first edge 10. In other words, the plurality of first doped sections 101 and the plurality of second doped sections 102 are alternatingly arranged in the first direction X, and the plurality of first doped sections 101 include an outermost first doped section 101 having its first portion 111 bordering one of the two first edges 10. The plurality of second portions 112 of the respective first doped region 101 and fourth portions 112 of a second doped region 102 next to the respective first doped region 101 are alternatingly arranged along the second direction Y. For example, each of the plurality of fourth portions 122 of the respective second doped section 102 protrudes into a space between respective two adjacent second portions 112 of a first doped region 101 next to the respective second doped region 102. In the respective first doped section 101, two outermost second portions 112 are respectively arranged on the two second edges 20. In other words, the plurality of second portions 112 of the respective first doped section 101 include an outermost second portion 112 bordering one of the two second edges 20, another outermost second portion bordering the other one of the two second edges 20, and one or more other second portions 112 between the two outermost second portions 112. In some embodiments, the back-contact solar cell includes a substrate 100 having a first side, and a doped layer formed on the first side. The first side has two opposing first edges 10 perpendicular to the first direction X and two opposing second edges 20 perpendicular the second direction Y. The first direction X is perpendicular to the second direction Y. The back-contact solar cell further includes: a plurality of first doped sections 101 formed on the first side. Each respective first doped section 10 of the plurality of first doped sections 101 includes a first portion 111 extending along the second direction Y, and a plurality of second portions 112 distributed at intervals along the second direction Y. Each of the plurality of second portions 112 protrudes from the first portion 111 in a direction parallel to the second edges. The back-contact solar cell further includes a plurality of second doped sections 102 formed on the first side. Each respective second doped section 102 of the plurality of second doped sections 102 includes a third portion 121 extending along the second direction Y, and a plurality of fourth portions 122 distributed at intervals along the second direction Y. Each of the fourth portions 122 protrudes from the third portion 121 in the direction parallel to the second edges. The respective second doped section 102 has a conductivity type different from a conductivity type of the respective first doped sections 101. In other words, the plurality of first doped sections 101 and the plurality of second doped sections 102 are alternatingly arranged in the first direction X, and the plurality of first doped sections 101 include an outermost first doped section 101 having its first portion 111 bordering one of the two first edges 10. The plurality of second portions 112 of the respective first doped region 101 and fourth portions 112 of a second doped region 102 next to the respective first doped region 101 are alternatingly arranged along the second direction Y. The plurality of second portions 112 of the respective first doped section 101 include an outermost second portion 112 bordering one of the two second edges 20, another outermost second portion bordering the other one of the two second edges 20, and one or more other second portions 112 between the two outermost second portions 112. In some embodiments, a doping element is implanted to the interior of an initial substrate from a side of the initial substrate (i.e., the first side of the substrate 100 formed subsequently) to transform a portion of a thickness of the initial substrate into an initial first doped section, with the remaining portion of the initial substrate as the substrate 100, and an interface between the substrate 100 and the initial first doped section as the first surface 1. The first doped sections 101 and the second doped sections 102 of different conductivity types are alternatingly arranged in the first surface 1, and two second edges 20 and at least one first edges 10 of the first surface 1 all include first doped sections 101, so that the edges of the first surface 1 can be utilized to a greatest extent to arrange as many first doped sections 101 as possible in the first surface. Furthermore, by taking advantage of the edge position of the first surface 1, the available area of the first surface 1 is increased, so that a higher number of second doped sections 102 can be arranged at non-edge positions. In this way, the number of electron-hole pairs is increased, and the recombination rate of carriers at the interface of the substrate 100 is further reduced, so that the photoelectric conversion efficiency of the back-contact solar cell is comprehensively improved.

It should be noted that the number of first doped sections 101 and the number of second doped sections 102 in FIG. 1 and FIG. 3 are only described as examples, and in practice, the number of first doped sections 101 and the number of second doped sections 102 in the actual back-contact solar cell are not limited.

The substrate 100 is configured to receive incident light and generate photo-generated carriers. In some embodiments, the substrate 100 may be a semiconductor substrate.

In some embodiments, the substrate 100 may be made of an elemental semiconductor material. Specifically, the elemental semiconductor material is formed of a single element, for example, silicon or germanium. The elemental semiconductor material may be a monocrystalline state, a polycrystalline state, an amorphous state, or a microcrystalline state (i.e., a state having both a monocrystalline state and an amorphous state). For example, silicon may be at least one of monocrystalline silicon, polycrystalline silicon, amorphous silicon, or microcrystalline silicon.

In some embodiments, the substrate 100 may also be made of a compound semiconductor material. Typical compound semiconductor materials include, but are not limited to, silicon germanium, silicon carbide, gallium arsenide, indium gallide, perovskite, cadmium telluride, copper indium selenium, or other materials.

The substrate 100 may be an N-type semiconductor substrate or a P-type semiconductor substrate. The N-type semiconductor substrate is doped with an N-type doping element. The N-type doping element may be any one of Group V elements, such as potassium (P), bismuth (Bi), antimony (Sb), or arsenic (As). The P-type semiconductor substrate is doped with a P-type doping element. The P-type doping element may be any one of group III elements, such as boron (B), aluminum (Al), gallium (Ga), or indium (In).

The substrate 100 includes a first surface 1 and a second surface 2 opposite to the first surface 1. In some embodiments, the back-contact solar cell is a single-sided cell, the second surface 2 of the substrate 100 may serve as a light-receiving surface configured to receive incident light, and the first surface 1 serves as a backlight surface.

In some embodiments, the back-contact solar cell is a double-sided cell, the second surface 2 and the first surface 1 of the substrate 100 may each serve as a light-receiving surface configured to receive incident light. It should be understood that the backlight surface referred to in the embodiments of the present disclosure can also receive incident light, and is defined as a backlight surface just because a proportion of incident light received by the backlight surface is less than a proportion of incident light received by the light receiving surface.

In some embodiments, at least one of the second surface 2 or the first surface 1 may be a textured surface, so that absorption and utilization of incident light by the second surface 2 and the first surface 1 of the substrate 100 can be enhanced. In some embodiments, the textured surface may be a pyramid textured surface, which, as a common textured surface, not only reduces reflectivity of the surface of the substrate 100, but also forms light traps, enhances the absorption of incident light by the substrate 100, and improves the conversion efficiency of the solar cell.

Specifically, in a case where the back-contact solar cell is a single-sided cell, a textured surface may be formed in a light-receiving surface of the substrate 100, for example, a pyramid textured surface, and the backlight surface of the substrate 100 may be a polished surface, that is, the backlight surface of the substrate 100 is more flat than the light-receiving surface. It should be noted that with respect to the single-sided cell, a textured surface may be formed on each of the light-receiving surface and the backlight surface of the substrate 100.

In a case where the back-contact solar cell is a double-sided cell, a textured surface may be formed on each of the light-receiving surface and the backlight surface of the substrate 100.

When incident light irradiates a PN junction, the PN junction generates corresponding electron-hole pairs, and under the action of a potential barrier electric field of the PN junction, the electron-hole pairs are separated, where electrons are driven to the N region, and holes are driven to the P region, thereby generating a photoelectric field. In this way, an electromotive force is generated between the N region and the P region, and photocurrent is output.

A built-in electric field directed from a second doped layer to the interior of the substrate 100 is formed in a high-low junction. Under the action of the built-in electric field, minority carriers make drift movement to make the minority carriers escape from the interface, and hence the recombination rate of carriers at the interface of the substrate 100 is reduced. In this way, an open-circuit voltage, a short-circuit current and a fill factor of the back-contact solar cell are enhanced, and the photoelectric conversion efficiency of the back-contact solar cell is improved.

In some embodiments, the first doped section 101 has a conductivity type different from a conductivity type of the substrate 100, and forms a PN junction with the substrate 100. In some embodiments, the second doped section 102 has a conductivity type same as a conductivity type of the substrate 100, and a doping element concentration of the second doped section 102 is larger than a doping element concentration of the substrate 100, so that a subsequently formed second doped layer forms a high-low junction. That is, the PN junctions have a larger area proportion in the first surface 1 than the high-low junctions.

It should be understood that with respect to the back-contact solar cell without a large recombination rate of carriers at the interface of the substrate 100, to improve the photoelectric conversion performance thereof, it is critical to increase the number of electron-hole pairs. Therefore, with respect to such back-contact solar cells, by providing a larger area proportion of the PN junctions, more electro-hole pairs can be generated, so that higher photocurrent is output, and hence the photoelectric conversion performance of the back-contact solar cell is improved.

In addition, in practical preparation of the PN junctions and the high-low junctions, first the substrate 100 is first subjected to diffusion processing, such that a portion of a thickness of the substrate 100 is converted into an emitter configured to form PN junctions.

Subsequently, the emitter is etched to form openings exposing the substrate 100, and remaining portions of the emitter form PN junction patterns.

Then, heavily doped layers are formed in openings, and a doping element concentration of each heavily doped layer is larger than that of the substrate 100 for formation of a high-low junction.

Subsequently, to form high-low junctions with predetermined patterns, a patterning process is performed on the heavily doped layer. In this operation, a mask needs to be formed on a surface of the heavily doped layer. However, due to not high precision of alignment of the mask (even lower for the heavily doped layer at the edge), a surface of a portion of the heavily doped layer that needs to be preserved may be removed during the patterning process because of not being covered by the mask, thereby resulting in intermittent patterning of the high-low junctions. Especially for the heavily doped layer at the edge, the high-low junctions are less contiguous, and voids may be created in the high-low junctions due to over-etching. On one hand, the area of the high-low junctions is subject to a loss, resulting in a decrease of the passivation effect of the high-low junctions on the interface of the substrate 100. On the other hand, a larger loss of recombination is caused at the edge, resulting in a higher rate of carrier recombination caused at the edge, which is not conducive to improving the performance of the back-contact solar cell.

In view of the above-mentioned phenomenon, the two second edges 20 and the two first edges 10 of the first surface 1 all include first doped sections 101, and the first doped sections 101 form PN junctions with the substrate 100, so that the high-low junctions has a less area proportion at the edge of the first surface 1. In this case, during the process of actually preparing the high-junctions, the problem of low film layer continuity of the high-low junction formed at the edge due to a low alignment accuracy of the mask for patterning of the high-low junction at the edge can be improved, and meanwhile the problem of an increased recombination loss at the edge due to the patterning process can also be improved.

It is not hard to find that in the embodiments of the present disclosure, space at the edges of the first surface is utilized to arrange first doped sections 101 and second doped sections 102 as many as possible in the first surface 1, so that the area proportion of the first doped sections 101 and second doped sections 102 in the first surface 1 is improved, and hence the area proportion of the PN junctions and high-low junctions in the first surface 1 is increased meanwhile. In this way, the number of electron-hole pairs is increased, and the recombination rate of carriers at the interface of the substrate 100 is reduced, thereby comprehensively improving the photoelectric conversion efficiency of the back-contact solar cell. In addition, the area proportion of the first doped sections 101 may be set to be larger than the area proportion of the second doped sections 102. With respect to the back-contact solar cells having different functional requirements, a conductivity type of the first doped section 101 is selected to improve the photoelectric conversion performance of the corresponding back-contact solar cell.

In some embodiments, the substrate 100 may be an N-type substrate, and the first doped section 101 may be doped with a P-type doping element. The P-type doping element may be any one of group III elements, such boron (B), aluminum (Al), gallium (Ga) or indium (In). In some embodiments, the second doped section 102 may be doped with an N-type doping element. The N-type doping element may be any one of group V elements, such as potassium (P), bismuth (Bi), antimony (Sb) or arsenic (As).

In some embodiments, the substrate 100 may also be a P-type substrate 100, and in this case, the first doped section 101 may be doped with an N-type doping element, and the second doped section 102 may be doped with a P-type doping element.

In some embodiments, it is also possible that the first doped section 101 has the same conductivity type as the substrate 100, and the first doped section 101 has a doping element concentration larger than that of the substrate 100 and forms a high-low junction with the substrate 100, and the second doped section 102 has a conductivity type different from a conductivity type of the substrate 100 and forms a PN junction with the substrate 100. Thus, the high-low junctions have a larger area proportion in the first surface 1 than the PN junctions, and the recombination rate of carriers at the interface of the substrate 100 is further reduced. For such back-contact solar cells with a relatively large density of defect states at the interface of the substrate 100 and then a relatively high recombination rate of carriers at the interface of the substrate 100, the high-low junctions are provided to have a larger area proportion in the first surface 1 so that recombination of carriers at the interface of the substrate 100 can be better inhibited. In this way, the open-circuit voltage, the short-circuit current and the fill factor of the back-contact solar cell are enhanced, and the photoelectric conversion efficiency of the back-contact solar cell is improved.

It should be noted that the first portion 111 being disposed at the first edge 10 referred to in the embodiments of the present disclosure may cover two cases. One case is that the first portion 111 is flush with the first edge 10. The other case is that a first predetermined gap is maintained between the first portion 111 and the first edge 10. That is, the first portion 111 and the first edge 10 may appear to be flush with each other to naked eyes, but due to the process, there may exist a small gap between the first portion 111 and the first edge 10. The first predetermined gap may be in the range of 1 µm to 200 µm, specifically, 1 µm, 10 µm, 20 µm, 35 µm, 50 µm, 70 µm, 90 µm, 100 µm, 120 µm, 140 µm, 155 µm, 175 µm, 180 µm, 195 µm, or 200 µm. With configuration of the first predetermined gap, on one hand, a reasonable error range is provided for the process of actually preparing the first portions 111, increasing a process window; on the other hand, first doped sections 101 and second doped sections 102 can be arranged in the first predetermined gap as many as possible, so that the area proportions of the first doped sections 101 and the second doped sections 102 in the first surface 1 are simultaneously improved.

The second portion 112 being disposed at the second edge 20 may also cover two cases. One case is that the second portion 112 is flush with the second edge 20. The other case is that a second predetermined gap may remain between the second portion 112 and the second edge 20. That is, the second portion 112 and the second edge 20 may appear to be flush with each other to the naked eyes, but due to the process, there may exist a small gap between the second portion 112 and the second edge 20. The second predetermined gap may be in the range of 1 µm to 200 µm, specifically, 1 µm, 10 µm, 20 µm, 35 µm, 50 µm, 70 µm, 90 µm, 100 µm, 120 µm, 140 µm, 155 µm, 175 µm, 180 µm, 195 µm, or 200 µm. With configuration of the second predetermined gap, on one hand, a reasonable error range is provided for the process of actually preparing the second portions 112, increasing a process window; on the other hand, first doped sections 101 and second doped sections 102 can be arranged in the second predetermined gap as many as possible, so that the area proportions of the first doped sections 101 and the second doped sections 102 in the first surface 1 are simultaneously improved.

Referring to FIG. 3, in some embodiments, the number of first doped sections 101 is equal to the number of second doped sections 102, and in the first portions 111 and the third portions 112 that are alternatingly arranged, a first portion 111 and a third portion 121 that are disposed on the outermost side are respectively arranged at the two first edges 10. In other words, the plurality of second doped sections 102 include an outermost second doped section 102 having its third portion 121 bordering the other one of the two first edges 10.

The number of first doped sections 101 being equal to the number of second doped sections 102 means that the number of first portions 111 is equal to the number of third portions 121, and in the first portions 111 and the third portions 121 that are alternatingly arranged, two portions disposed on the outermost side are a first portion 111 and a third portion 121 respectively. The first portion 111 disposed at one of the two first edges 10, and the third portion 121 is disposed at the other of the two first edges 10. That is, a first doped section 101 and a second doped section 102 are respectively arranged at the two first edges 10. In this way, the area proportion of the second doped sections 102 in the first surface 1 is increased while increasing the area proportion of the first doped sections 101 in the first surface 1.

In a specific example, the first doped section 101 forms a PN junction with the substrate 100, and the second doped section 102 forms a high-low junction with the substrate 100. The first doped section 101 and the second doped section 102 are respectively arranged at the two first edges 10, so that the area proportion of the high-low junctions in the first surface 1 is further increased while increasing the area proportion of the PN junctions in the first surface 1. In this way, the capability of the high-low junctions to inhibit recombination of carriers at the interface of the substrate 100 is improved while increasing the number of electron-hole pairs generated by the PN junctions.

Furthermore, of the four edges of the first surface 1, three edges are provided to include first doped sections 101 and only one edge is provided to include a second doped section 102. That is, the three edges are configured as PN junctions, and the one edge is configured as a high-low junction, so that there are fewer high-low junctions at the edges of the first surface 1 compared to the PN junctions. As such, in the process of preparing a high-low junction pattern using a patterning process, fewer masks for patterning are used at the edge of the first surface 1, so that the problem of low film layer continuity of the high-low junction formed at the edge due to a low alignment accuracy of the mask for patterning of the high-low junction at the edge can be improved, and meanwhile the problem of an increased recombination loss at the edge due to the patterning process can also be improved.

It should be noted that the third portion 121 being disposed at the first edge 10 in the embodiments of the present disclosure may cover two cases. One case is that the third portion 121 is flush with the first edge 10. The other case is that a first predetermined gap is maintained between the third portion 121 and the first edge 10. That is, the third portion 121 and the first edge 10 may appear to be flush with each other to naked eyes, but due to the process, there may exist a small gap between the third portion 121 and the first edge 10. The third predetermined gap may be in the range of 1 μm to 200 μm, specifically, 1 μm, 10 μm, 20 μm, 35 μm, 50 μm, 70 μm, 90 μm, 100 μm, 120 μm, 140 μm, 155 μm, 175 μm, 180 μm, 195 μm, or 200 μm. With configuration of the third predetermined gap, a reasonable error range may be provided for the process of actually preparing the third portions 121, increasing the process window.

Referring to FIG. 1, in some embodiments, the number of first doped sections 101 is larger than the number of second doped sections 102, and in the first portions 111 and the second portions 112 that are alternatingly arranged, two first portions 111 that are disposed on the outermost side are respectively arranged at the two first edges 10. In other words, the plurality of first doped sections 101 further include another outermost first doped section 101 having its first portion 111 bordering the other one of the two first edges 10.

The number of first doped sections 101 being larger than the number of second doped sections 102 means that the number of first portions 111 is larger than the number of third portions 121, and in the first portions 111 and the third portions 121 that are alternatingly arranged, two portions arranged on the outermost side are two first portions 111 respectively. That is, a first doped section 101 is arranged at each of the two first edges 10. In this way, the area proportion of the second doped sections 101 in the first surface 1 is increased. Specifically, the number of first doped sections 101 is equal to one plus the number of second doped sections 102.

In a specific example, the first doped section 101 forms a PN junction with the substrate 100, and the second doped section 102 forms a high-low junction with the substrate 100. A first doped section 101 and a second doped section 102 are arranged at the two first edges 10 respectively, so that the area proportion of the PN junctions in the first surface 1 is relatively large. In this way, the number of electron-hole pairs generated by the PN junctions is increased.

Furthermore, a first doped section 101 is arranged at each of four edges of the first surface 1. That is, the four edges are configured as PN junctions. As such, in the process of preparing a high-low junction pattern using a patterning process, no mask for patterning is used at the edges of the first surface 1, so that the problem of low film layer continuity of the high-low junction formed at the edge due to a low alignment accuracy of the mask for patterning of the high-low junction at the edge can be improved, and meanwhile the problem of an increased recombination loss at the edge due to the patterning process can also be improved.

In a first doped section 101, a plurality of second portions 112 distributed at intervals along the second direction Y are denoted as a column of second portions, and in the plurality of first doped sections 101 distributed at intervals, each first doped section 101 includes a column of second portions, and a plurality of columns of second portions are distributed at intervals along the first direction X.

Figure 4:
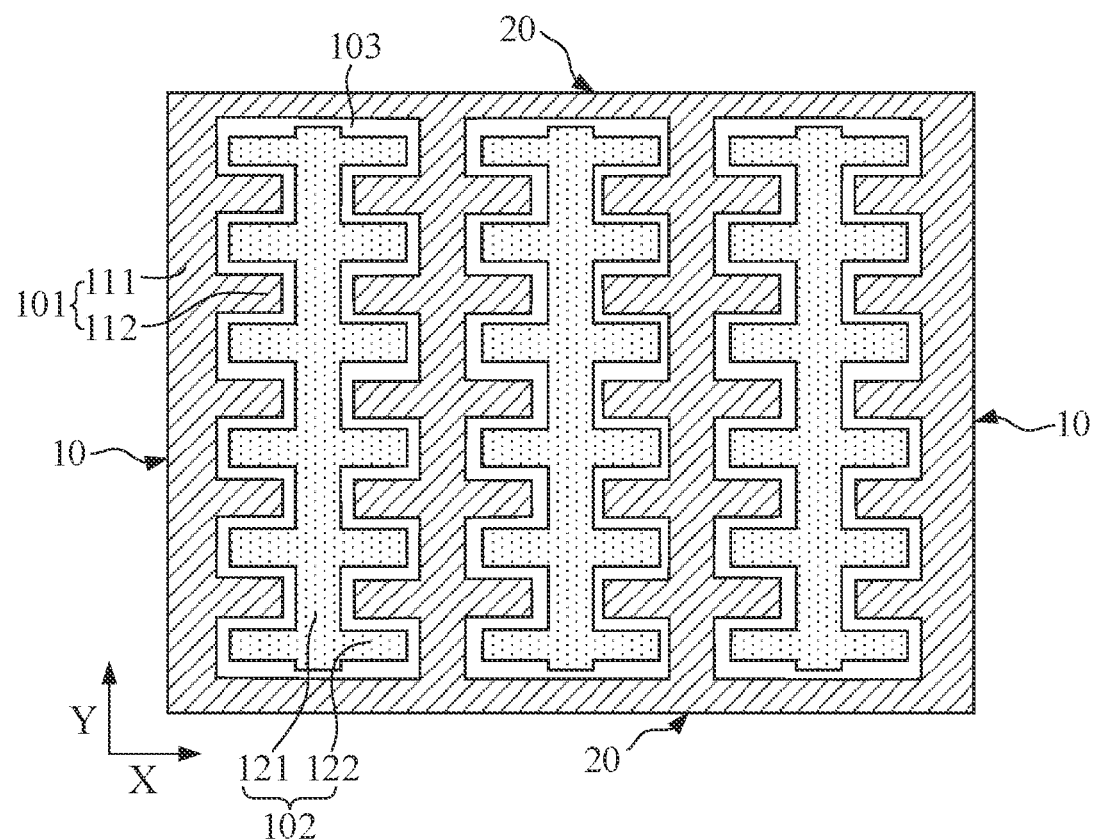
FIG. 4 is a schematic top view of yet another back-contact solar cell according to some embodiments of the present disclosure.

FIG. 4 is a schematic top view of a back-contact solar cell according to some embodiments of the present disclosure.

Referring to FIG. 4, in some embodiments, in two adjacent columns of second portions of a plurality of columns of second portions distributed at intervals along the first direction X, adjacent second portions disposed on the outermost side are connected to each other, and disposed on a second edge 20. In this way, the area proportion of the first doped sections 101 in the first surface 1 is further increased.

It should be noted that since the second portions connected to each other are disposed at the second edge 20, two opposite ends of the second doped section 102 along the second direction Y are not disposed at the second edges 20.

Referring to FIG. 3, in some embodiments, in the first portions 111 distributed at intervals along the first direction X, a first portion 111 disposed at the first edge 10 is denoted as an edge first portion, and the remaining first portions 111 are denoted as non-edge first portions, where a width d1 of the edge first portion is larger than a width d2 of a respective non-edge first portion of the non-edge first portions along the first direction X. In other words, the plurality of first doped sections 101 include first doped sections 101 having their first portions 111 not bordering the two first edges 10, and a width of the first portion 111 bordering the one of the two first edges is larger than a width of any of the first portions 111 not bordering the two first edges.

It may be understood that alignment in the patterning process at the edge is more difficult for the patterning process of the first portions 111, and therefore, the first portion 111 at the first edge 10 is provided to have a larger width, providing a larger error allowance for the patterning process of the first portion 111 at the first edge 10, so that the difficulty of the patterning process is lowered. In other words, the width of the edge first portion is provided in advance to be larger, so that even if the first portion 111 at the edge is excessively etched due to process alignment in the patterning process for forming the first portions 111, the width of the edge first portion finally formed may not be excessively small.

In some embodiments, a difference between the width of the edge first portion and the width of the non-edge first portion is in the range of 50 μm to 200 μm, for example, 50 μm to 75 μm, 75 μm to 90 μm, 90 μm to 100 μm, 100 μm to 120 μm, 120 μm to 150 μm, 150 μm to 170 μm, 170 μm to 180 μm, 180 μm to 190 μm, or 190 μm to 200 μm. Within the above range, the width of the edge first portion is larger than that of the non-edge first portion, so that the difficulty of patterning the edge first portion is lowered. On the other hand, within the above range, the width of the non-edge first portion is not excessively small compared with the width of the edge first portion, that is, ensuring that the width of the non-edge first portion itself is not excessively small. In this way, it is ensured that the overall area proportion of the first doped sections 101 in the first surface 1 is still large, and the back contact solar cell has good photoelectric conversion performance.

In some embodiments, the width of the edge first portion may also be equal to a width of a non-edge first portion along the first direction X.

Referring to FIG. 3, in some embodiments, in the third portions 121 distributed at intervals along the first direction X, a third portion 121 disposed at the first edge 10 is denoted as an edge third portion, and the remaining third portions 121 are denoted as non-edge third portions, where a width d3 of the edge third portion is larger than a width d4 of a respective non-edge third portion of the non-edge third portions along the first direction X. In other words, the plurality of second doped sections 102 include second doped sections 102 having their third portions 121 not bordering the two first edges 10, and a width of the third portion 121 bordering the other one of the two first edges 10 is larger than that of any of the third portions 121 not bordering the two first edges 10.

The third portion 121 at the first edge 10 is provided to have a larger width, providing a larger error allowance for the patterning process of the third portion 121 at the first edge 10, so that the difficulty of the patterning process for the third portion 121 at the first edge 10 is lowered. In other words, the width of the edge third portion is provided in advance to be larger, so that even if the third portion 121 at the edge is excessively etched due to process alignment in the patterning process for forming the third portions 121, the width of the edge third portion finally formed may not be excessively small.

In some embodiments, a difference between the width of the edge third portion and the width of the non-edge third portion is in the range of 50 μm to 200 μm, for example, 50 μm to 75 μm, 75 μm to 90 μm, 90 μm to 100 μm, 100 μm to 120 μm, 120 μm to 150 μm, 150 μm to 170 μm, 170 μm to 180 μm, 180 μm to 190 μm, or 190 μm to 200μ m. Within the above range, the width of the edge third portion is larger than that of the non-edge third portion, such that the difficulty of patterning the edge third portion is lowered. On the other hand, within the above range, the width of the non-edge third portion is not excessively small compared with the width of the edge third portion, that is, ensuring that the width of the non-edge third portion itself is not excessively small. In this way, it is ensured that the overall area proportion of the second doped sections 102 in the first surface 1 is still large, and the back contact solar cell has better photoelectric conversion performance.

In some embodiments, the width of the edge third portion may also be equal to a width of a non-edge third portion along the first direction X.

Referring to FIG. 3, in some embodiments, in the plurality of second portions 112 in each first doped section 101, a second portion 112 disposed on the outermost side is denoted as an edge second portion and, the remaining second portions 112 are denoted as non-edge second portions, where along the second direction Y, a width d5 of the edge second portion differs by a first difference from a width d6 of a respective non-edge second portion of the non-edge second portions. In other words, each of a width of the outermost second portion 112 bordering the one of the two second edges 20 and a width of the another outermost second portion 112 bordering the other one of the two second edges 20 differs by a first difference from a width of any of the one or more other second portions 112 between the two outermost second portions 112.

That is, a width error is allowed between the second portions 112 disposed at the second edge 20 and the second portions 112 not disposed at the second edge 20, and in the actual process of preparing the edge second portion, the width of the edge second portion may be made smaller than the width of the non-edge second portion, and may also be made larger than the width of the non-edge second portion, so that a larger process window is provided for the process of preparing the edge second portion, and the process difficulty of preparing the edge second portion is lowered.

In a specific example, along the second direction Y, the width of the edge second portion may be larger than the width of the non-edge second portion. In a specific example, along the second direction Y, the width of the edge second portion may also be smaller than the width of the non-edge second portion. Any width can do with the edge second portion or the non-edge second portion as long as the width of the edge second portion differs by the first difference from the width of the non-edge second portion.

In some embodiments, the first difference is in the range of 0 to 50 μm, for example, 0 to 1 μm, 1 μm to 5 μm, 5 μm to 10 μm, 10 μm to 20 μm, 20 μm to 25 μm, 25 μm to 30 μm, 30 μm to 35 μm, 35 μm to 40 μm, 40 μm to 45 μm, 45 μm to 49 μm, or 49 μm to 50 μm. Within the above range, on one han, a larger error allowance range is provided for the process of preparing the edge second portion, and hence the process difficulty is lowered. On the other hand, the difference between the width of the edge second portion and the width of the non-edge second portion is not excessively large, so that the problem of the edge second portion being excessively small compared with the non-edge second portion or the non-edge second portion being excessively small compared with the edge second portion is avoided, and the overall area of the first doped sections 101 is kept large. In this way, a larger process window is provided for the process of preparing the edge second portion.

Referring to FIG. 1 and FIG. 3, in some embodiments, two ends of the third portion 121 in the second direction Y are respectively coincident with the two second edges 20.

That is to say, two opposite edges of the third portion 121 along the second direction Y are respectively flush with the two second edges 20, so that the dimension of the third portion 121 along the second direction Y is relatively large. In this way, the area of the third portion 121 can be increased, and the area of the second doped section 102 is increased. Thus, the area of the first surface 1 can be utilized to a greater extent to increase the areas of the first doped sections 101 and the second doped sections 102, and the performance of the first doped sections 101 and the second doped sections 102 is enhanced.

Figure 5:
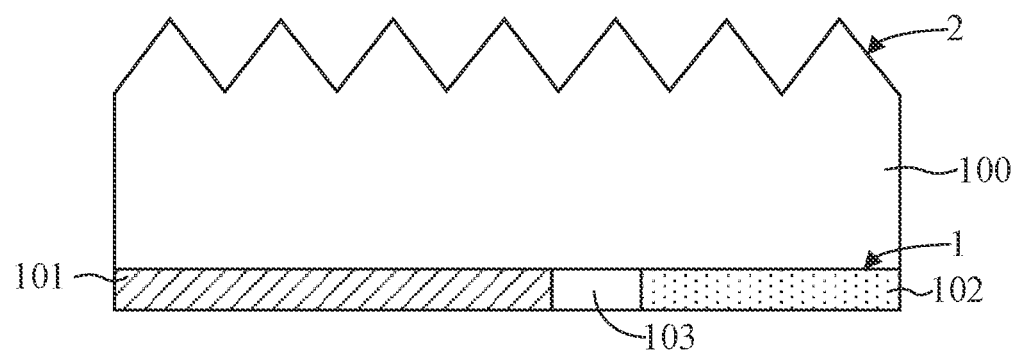
FIG. 5 is a schematic sectional view of a second back-contact solar cell according to some embodiments of the present disclosure.

FIG. 5 is a schematic sectional view taken along an AA' direction (referring to the AA' direction in FIG. 3) of a second back-contact solar cell according to some embodiments of the present disclosure.

Referring to FIGS. 1 to 5, in some embodiments, the first doped sections 101 are spaced apart from the second doped sections 102, and the back-contact solar cell further includes: isolation structures 103, where each respective isolation structure 103 of the isolation structures 103 is interposed between the respective first doped section 101 and the respective second doped section 102. The isolation structure 103 has an insulation effect on the first doped section 101 and the second doped section 102, so that electrical interference between the first doped section 101 and the second doped section 102 is prevented.

Specifically, the isolation structure 103 is disposed between a first portion 111 and a third portion 121 that are adjacent along the first direction X, and also disposed between a second portion 112 and a third portion 121 that are staggered along the second direction Y. In other words, the isolation structure 103 may fill the gap between the first doped section 101 and the second doped section 102, and hence integrally isolates the first doped section 101 from the second doped section 102.

In some embodiments, a material of the isolation structure 103 may include an insulating material, such as silicon oxide or silicon nitride.

Figure 6:
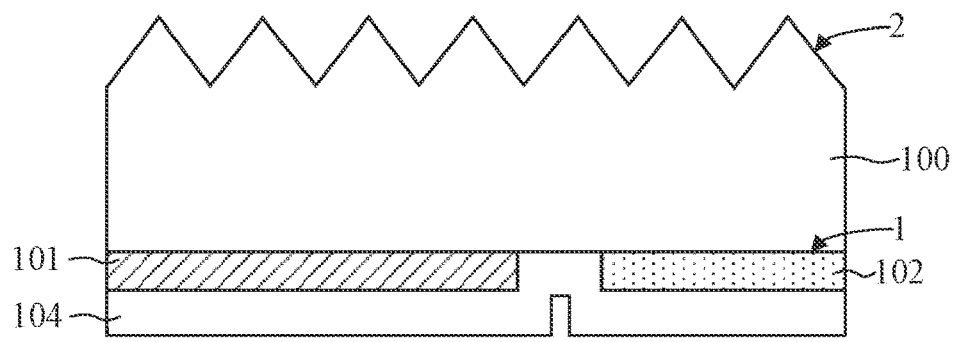
FIG. 6 is a schematic sectional view of a third back-contact solar cell according to some embodiments of the present disclosure.

FIG. 6 is a schematic sectional view taken along an AA' direction (referring to the AA' direction in FIG. 3) of a third back-contact solar cell according to some embodiments of the present disclosure.

Referring to FIG. 6, in some embodiments, the back-contact solar cell further includes a first passivation layer 104. The first passivation layer 104 covers a surface, away from the substrate 100, of the first doped section 101, and a surface, away from the substrate 100, of the second doped section 102. The first passivation layer 104 also fills a gap between the first doped section 101 and the second doped section 102. The first passivation layer 104 disposed between the first doped section 101 and the second doped section 102 serves as an isolation structure.

On one hand, the first passivation layer 104 has a good passivation effect on the surface of the substrate 100, reduces the density of defect states on the surface of the substrate 100, better inhibits recombination of carriers in the surface of the substrate 100, and achieves an anti-reflection effect. On the other hand, the first passivation layer 104 also isolates the first doped section 101 from the second doped section 102. By configuring the first passivation layer 104 as an isolation structure, an additional process for preparing an isolation structure can be eliminated, so that the process flow is simplified, and the process efficiency is improved.

In some embodiments, the first passivation layer 104 may has a single-layered structure, and in other embodiments, the first passivation layer 104 may also has a multi-layered structure. In some embodiments, a material of the first passivation layer 104 includes at least one of silicon oxide, aluminum oxide, silicon nitride, or silicon oxynitride.

Figure 7:
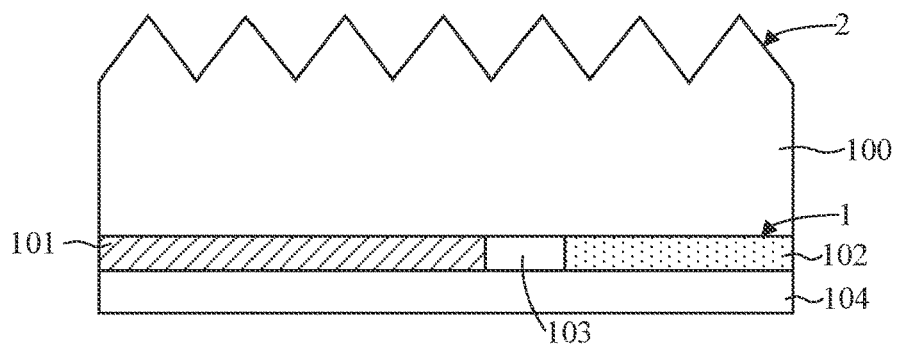
FIG. 7 is a schematic sectional view of a fourth back-contact solar cell according to some embodiments of the present disclosure.

FIG. 7 is a schematic sectional view taken along an AA' direction (referring to the AA' direction in FIG. 3) of a fourth back-contact solar cell according to some embodiments of the present disclosure.

Referring to FIG. 7, in other embodiments, the first passivation layer 104 may not serve as an isolation structure. That is, the isolation structure 103 and the first passivation layer 104 are two separate structures. The first passivation layer 104 may cover both the surface, away from the substrate 100, of the first doped section 101, the surface, away from the substrate 100, of the second doped section 102, and the surface of the isolation structure 103.

Figure 8:
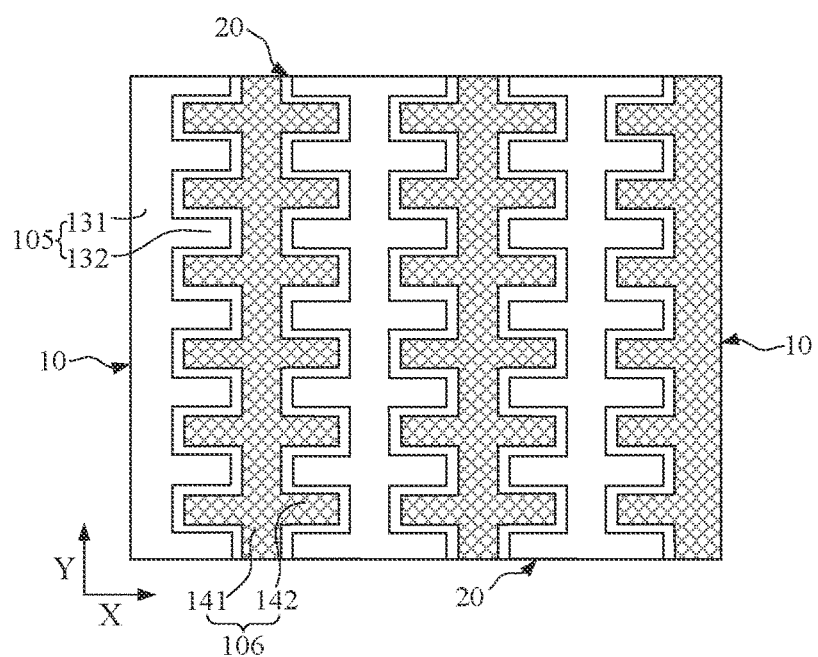
FIG. 8 is a schematic top view of still another back-contact solar cell according to some embodiments of the present disclosure.

FIG. 8 is a schematic top view of still another back-contact solar cell according to some embodiments of the present disclosure.

Referring to FIG. 8, in some embodiments, the back-contact solar cell further includes: a plurality of first grids 105 and a plurality of second grids 106. Each respective first grid 105 of the plurality of first grids 105 include a first busbar 131, and a plurality of first fingers 132 distributed at intervals along the second direction X. The first busbar 131 extends along the second direction Y. An orthographic projection of the first busbar 131 on the first surface 1 is in a surface of the first portion 111, and an orthographic projection of each respective first finger 132 of the plurality of first fingers 132 on the first surface 1 is in a surface of a respective second portion 112. Each respective second grid 106 of the plurality of second grids 106 includes a second busbar 141, and a plurality of second fingers 142 distributed at intervals along the second direction Y. The second busbar 141 extends along the second direction Y. An orthographic projection of the second busbar 141 on the first surface is in the surface of the third portion 121, and an orthographic projection of each respective second finger 142 of the plurality of second fingers 142 on the first surface 1 is in a surface of a fourth portion 122.

The first grid 105 is electrically connected to the first doped section 101, and the second grid 106 is electrically connected to the second doped section 102. The first grid 105 and the second grid 106 are configured to collect photocurrent.

In some embodiments, the first finger 132 may penetrate the first passivation layer 104 to be in electrical contact with the first doped section 101, and the second finger 142 penetrate the first passivation layer 104 to in electrical contact with the second doped section 102. The first finger 132 and the second finger 142 are configured to collect photocurrent in the first doped section 101 and the second doped section 102 respectively, and the first busbar 131 is electrically connected to the plurality of first fingers 132 to collect photocurrent in the plurality of first fingers 132. The second busbar 141 is electrically connected to the plurality of second fingers 142 to collect photocurrent in the plurality of second fingers 142. In some embodiments, the first busbar 131 and the second busbar 141 may be formed over the surface of the first passivation layer 104.

In some embodiments, materials of the first grid 105 and the second grid 106 may include a metallic material, such as copper or nickel.

In some embodiments, along the second direction Y, a width of the first portion 111 is larger than a width of the first busbar 131, and a width of the third portion 121 is larger than a width of the second busbar 141. As such, in the operation of actually forming the first busbar 131 and the second busbar 141, an accuracy of alignment of the first busbar 131 with the first portion 111 and an accuracy of alignment of the second busbar 141 with the third portion 121 are both increased. This is conducive to ensuring that the orthographic projection of the first busbar 131 on the first surface 1 is in the surface of the first portion 111 and the orthographic projection of the second busbar 141 on the first surface 1 is in the surface of the third portion 121.

In some embodiments, a difference between the width of the first busbar 131 and the width of the first portion 111 is in the range of 50 μm to 200 μm, for example, 50 μm to 55 μm, 55 μm to 80 μm, 80 μm to 100 μm, 100 μm to 120 μm, 120 μm to 150 μm, 150 μm to 180 μm, or 180 μm to 200 μm. In some embodiments, a difference between the width of the second busbar 141 and the width of the third portion 121 is in the range of 50 μm to 200 μm, for example, 50 μm to 55 μm, 55 μm to 80 μm, 80 μm to 100 μm, 100 μm to 120 μm, 120 μm to 150 μm, 150 μm to 180 μm, or 180 μm to 200 μm. Within the above range, the accuracy of alignment of the first busbar 131 with the first portion 111 and the accuracy of alignment of the second busbar 141 with the third portion 121 are both improved; and meanwhile, the width of the first busbar 131 is not excessively small compared with the first portion 111, and the width of the second busbar 141 is not excessively small compared with the second portion 112, to ensure that overall dimensions of the first busbar 131 and the second busbar 141 are not excessively small, and maintain a better collection effect of the photocurrent by the first busbar 131 and the second busbar 141.

In an operation of actually forming the first busbar 131 and the second busbar 141, the first busbar 131 and the second busbar 141 are typically printed using a screen printing process and based on the widths of the first portion 111 and the third portion 121 respectively. Specifically, openings of the screen printing plate are aligned with the first portion 111 and the third portion 121, and the first busbar 131 and the second busbar 141 are printed into the openings. In this manner, the first busbar 131 is aligned with the first portion 111, the second busbar 141 is aligned with the third portion 121, the width of the first busbar 131 varies with the width of the first portion 111, and the width of the second busbar 141 varies with the width of the third portion 121. Printing of the first busbar 131 and the second busbar 141 at the first edges 10 would be more difficult, easily causing a problem that the widths of the first busbar 131 and the second busbar 141 may be much smaller than the widths of the first portion 111 and the third portion 121. As a result, the widths of the first busbar 131 and the second busbar 141 may be excessively small, which impairs the current collection capability of the first busbar 131 and the second busbar 141.

In view of the above problem, in a specific example, along the second direction Y, the width of the edge first portion is larger than the width of the non-edge first portion, and the width of the edge third portion is larger than the width of the non-edge third portion. As such, the widths of the first busbar 131 and the second busbar 141 at the first edge 10 may be much smaller than the width of the edge first portion and the width of the edge third portion due to the process. However, since the width of the edge first portion and the width of the edge third portion are relatively large per se, the widths of the first busbar 131 and the second busbar 141 at the first edges 10 would not be excessively small, so that it is ensured that the first busbar 131 and the second busbar 141 at the first edges 10 have a better current collection capability.

In the back-contact solar cell according to the embodiments of the present disclosure, the first doped sections 101 and the second doped sections 102 of different conductivity types are alternatingly arranged in the first surface 1, and two second edges 20 and at least one first edges 10 of the first surface 1 all include first doped sections 101, so that the edges of the first surface can be utilized to a greatest extent to arrange as many first doped sections 101 as possible in the first surface 1. Furthermore, by taking advantage of the edge position of the first surface 1, the available area of the first surface 1 is increased, so that a higher number of second doped sections 102 can be arranged at non-edge positions. In this way, the number of electron-hole pairs is increased, and the recombination rate of carriers at the interface of the substrate 100 is further reduced, such that the photoelectric conversion efficiency of the back-contact solar cell is comprehensively improved.

Figure 9:
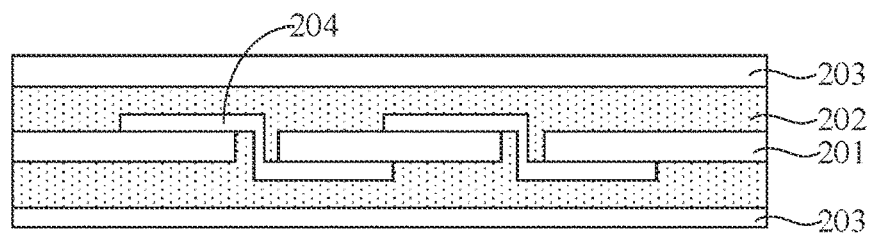
FIG. 9 is a schematic sectional view of a photovoltaic module according to some embodiments of the present disclosure.

Accordingly, some embodiments of the present disclosure further provide a photovoltaic module. Referring to FIG. 9, the photovoltaic module includes at least one cell string, an encapsulation layer 202 and a cover plate 203. Each cell string is formed by connecting the back-contact solar cells 201 according to the foregoing embodiments. The encapsulation layer 202 is configured to cover a surface of the at least one cell string. The cover plate 203 is configured to cover a surface, away from the at least one cell string, of the encapsulation layer 202.

The back-contact solar cell 201 are electrically connected in a form of a whole slice or a plurality of slices to form a plurality of cell strings, and the plurality of cell strings are electrically connected in a series connection and/or parallel connection manner. Specifically, in some embodiments, a plurality of cell strings may be electrically connected by a conductive strip 204. The encapsulation layer 202 covers first surfaces and second surfaces of the solar cells 201. Specifically, the encapsulation layer 202 may be an organic encapsulation film such as a polyvinyl butyral (PVB) adhesive film, an ethylene-vinyl acetate (EVA) adhesive film, a polyethylene octene co-elastomer (POE) adhesive film, or a polyethylene terephthalate (PET) adhesive film. In some embodiments, the cover plate 203 may be a glass cover, a plastic cover, or the like that has a light transmission function. Specifically, a surface, facing the encapsulation layer 202, of the cover plate 203 may be an uneven surface, thereby increasing the utilization rate of incident light.

Accordingly, some embodiments of the present disclosure further provide a method for preparing a back-contact solar cell. The method may be employed to prepare the back-contact solar cell according to the foregoing embodiments. A method for preparing the back-contact solar cell according to another embodiment of the present disclosure is described in detail hereinafter with reference to the accompanying drawings.

Figure 10:
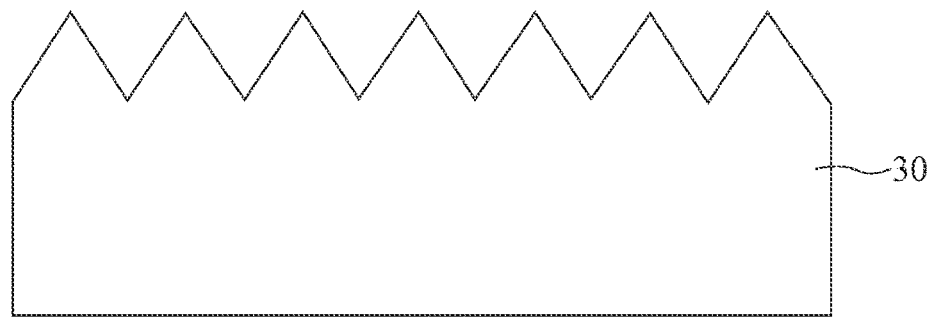
FIG. 10 is a schematic sectional view corresponding to operations of providing an initial substrate in a method for preparing a back-contact solar cell according to some embodiments of the present disclosure.
Figure 11:
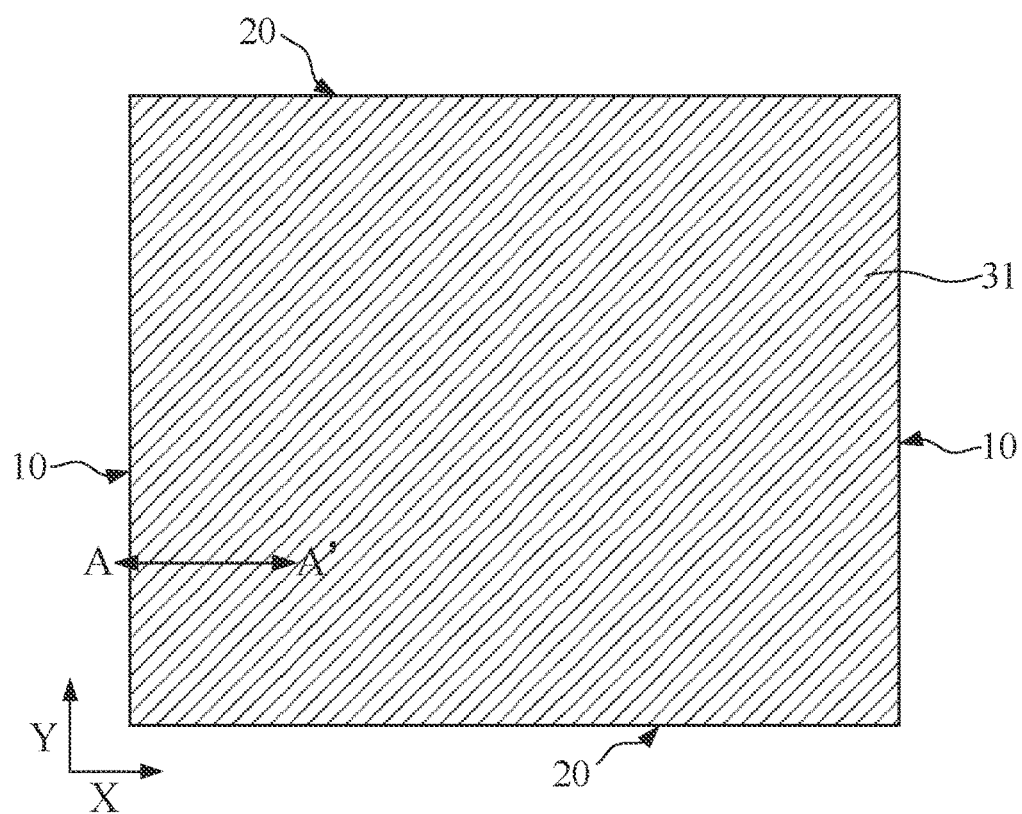
FIG. 11 is a schematic top view corresponding to operations of forming an initial first doped section in a method for preparing a back-contact solar cell according to some embodiments of the present disclosure.
Figure 12:
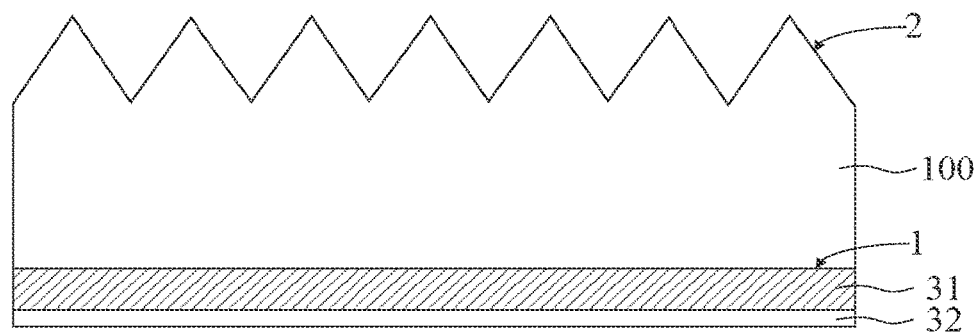
FIG. 12 is a schematic sectional view corresponding to operations of forming an initial first doped section in a method for preparing a back-contact solar cell according to some embodiments of the present disclosure.
Figure 13:
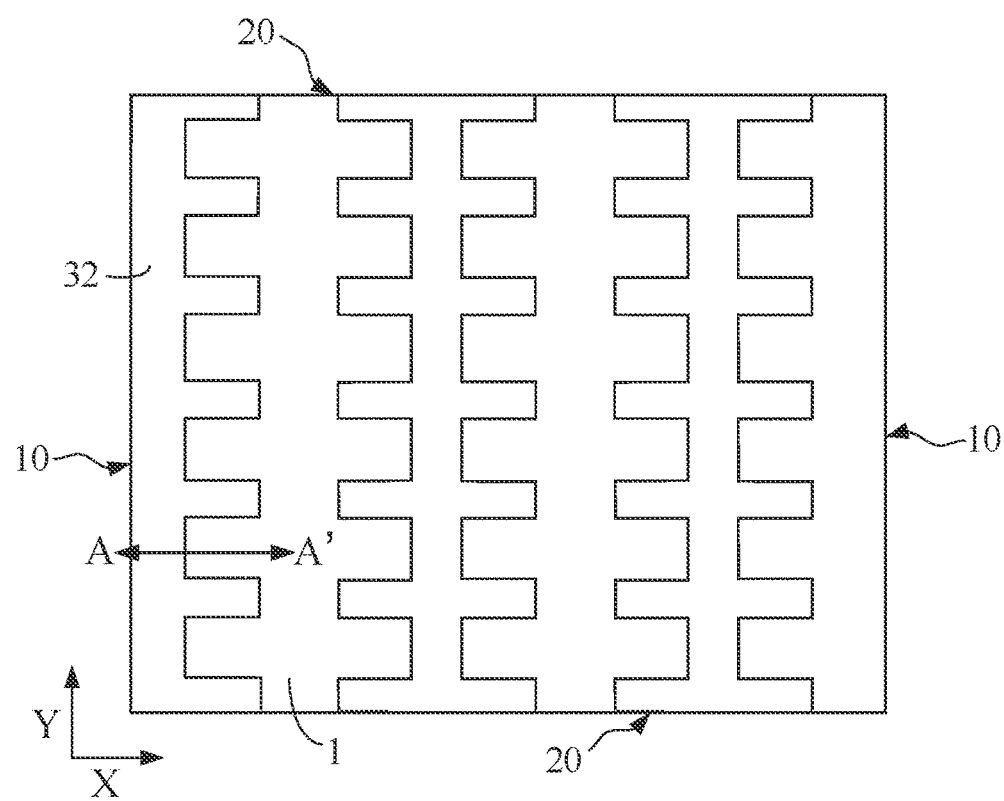
FIG. 13 is a schematic top view corresponding to operations of forming a first doped section and a first glass layer in a method for preparing a back-contact solar cell according to some embodiments of the present disclosure.

FIG. 10 is a schematic sectional view corresponding to operations of providing an initial substrate in a method for preparing a back-contact solar cell according to some embodiments of the present disclosure. FIG. 11 is a schematic top view corresponding to operations of forming an initial first doped section in a method for preparing a back-contact solar cell according to some embodiments of the present disclosure. FIG. 12 is a schematic sectional view, taken along an AA' direction (referring to the AA' direction in FIG. 11), corresponding to operations of forming an initial first doped section in a method for preparing a back-contact solar cell according to some embodiments of the present disclosure. FIG. 13 is a schematic top view corresponding to operations of forming a first doped section and a first glass layer in a method for preparing a back-contact solar cell according to some embodiments of the present disclosure.

Figure 14:
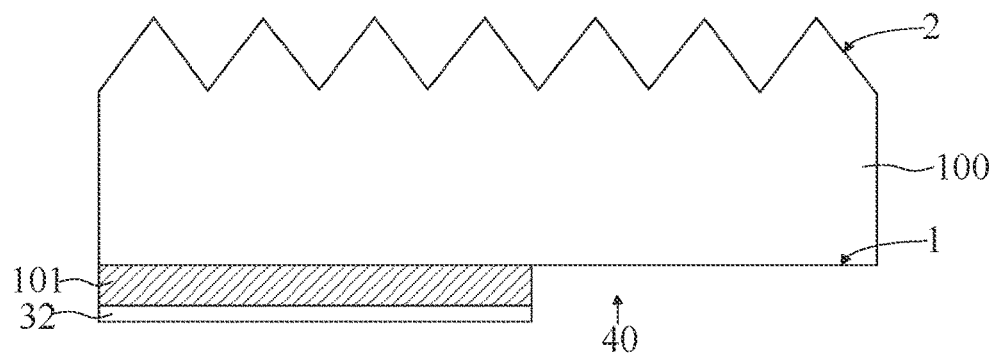
FIG. 14 is a schematic sectional view corresponding to operations of forming a first doped section and a first glass layer in a method for preparing a back-contact solar cell according to some embodiments of the present disclosure.

FIG. 14 is a schematic sectional view, taken along an AA' direction, corresponding to operations of forming a first doped section and a first glass layer in a method for preparing a back-contact solar cell according to some embodiments of the present disclosure. FIG. 12 is a schematic sectional structural diagram of the back-contact solar cell taken along an AA' direction. For the AA' direction, reference may be made to the AA' direction in FIG. 11. FIG. 14 is a schematic sectional view of the back-contact solar cell in FIG. 13 taken along an AA' direction.

The method for preparing the back-contact solar cell includes: providing a substrate 100, where the substrate 100 has a first side, the first side having two opposing first edges 10 perpendicular to the first direction X and two opposing second edges 20 perpendicular the second direction Y, the first direction X being perpendicular to the second direction Y; forming a doped layer on the first side, including: forming a plurality of doped sections 101, each respective first doped section 101 of the first doped sections 101 including a first portion 111 extending along the second direction Y and a plurality of second portions 112 distributed at intervals along the second direction Y, each of the second portions 112 extending along the first direction X and protruding from the first portion 111 in a direction parallel to the second edges.

In some embodiments, the substrate 100 may be made of an elemental semiconductor material. Specifically, the elemental semiconductor material is formed of a single element, for example, silicon or germanium. The elemental semiconductor material may be a monocrystalline state, a polycrystalline state, an amorphous state, or a microcrystalline state (i.e., a state having both a monocrystalline state and an amorphous state). For example, silicon may be at least one of monocrystalline silicon, polycrystalline silicon, amorphous silicon, or microcrystalline silicon.

In some embodiments, the substrate 100 may also be made of a compound semiconductor material. Typical compound semiconductor materials include, but are not limited to, silicon germanium, silicon carbide, gallium arsenide, indium gallide, perovskite, cadmium telluride, copper indium selenium, or other materials.

The substrate 100 may be an N-type semiconductor substrate or a P-type semiconductor substrate. The N-type semiconductor substrate is doped with an N-type doping element. The N-type doping element may be any one of group V elements such as potassium (P), bismuth (Bi), antimony (Sb) or arsenic (As). The P-type semiconductor substrate is doped with a P-type doping element. The P-type doping element may be any one of group III elements such as boron (B), aluminum (Al), gallium (Ga) or indium (In).

The substrate 100 includes a second surface 2 opposite to the first surface 1. In some embodiments, at least one of the second surface 2 or the first surface 1 of the substrate 100 may be subjected to texturing processing to form a textured surface on at least one of the second surface 2 or the first surface 1 of the substrate 100. In some embodiments, the textured surface may be a pyramid textured surface, which, as a common textured surface, not only reduces reflectivity of the surface of the substrate 100, but also forms light traps, enhances the absorption of incident light by the substrate 100, and improves the conversion efficiency of the solar cell.

In some embodiments, operations of forming the plurality of first doped sections 101 include: providing an initial substrate 30, where the initial substrate 30 is doped with a first doping element, referring to FIG. 10.

Referring to FIG. 11, a doping process is adopted to implant a second doping element to the interior of the initial substrate 30 from a surface of the initial substrate 30 (referring to FIG. 10) to transform a portion of a thickness of the initial substrate 30 into an initial first doped section 31, with the remaining portion of the initial substrate 30 as the substrate 100, where the second doping element has a conductivity type different from a conductivity type of the first doping element. The interface of the substrate 100 with the initial first doped section 31 may serve as the first surface 1.

Referring to FIG. 12, in some embodiments, the initial substrate 30 is a silicon substrate, and a first glass layer 32 is also formed over a surface of the initial first doped section 31 during the diffusion process. The first glass layer 32 is composed of a second doping element, silicon, and oxygen.

In a specific example, the initial substrate 30 is an N-type silicon substrate, and the second doping element may be boron. The initial substrate 30 may be placed in a diffusion furnace and subjected to a boron diffusion process at a temperature of 800° C. to 1200° C. for a duration of 2 hours to 5 hours to form the initial first doped section 31. During the diffusion, silicon in the initial substrate 30 reacts with boron and oxygen in the diffusion furnace to form the first glass layer 32 (specifically, a borosilicate glass layer, which is composed of boron trioxide and silicon dioxide) on the surface of the initial first doped section 31.

Referring to FIG. 13 and FIG. 14, after forming the initial first doped section 31, a first patterning process is performed on the initial first doped section 31 to form first doped sections 101 having predetermined patterns.

In some embodiments, the first patterning process includes: removing portions of the initial first doped section 31 by etching in a laser process to form first openings 40, where remaining portions of the initial first doped section 31 form the first doped sections 101. The first openings 40 expose the first surface 1 of the substrate 100, and portions of the first glass layer 32 aligned with the first openings 40 are also removed in the laser process.

The laser used in the laser process may be any one of infrared laser, green laser, or ultraviolet laser; or the laser used in the laser processing may be any one of carbon dioxide laser, excimer laser, titanium sapphire laser, or semiconductor laser. There is no restriction on the type of the laser in the embodiments of the present disclosure.

In some embodiments, after removing the portions of the initial first doped section 31 and the corresponding portions of the first glass layer 32 in a laser process, in order to reduce/remove laser damage at the first openings 40, the substrate 100 exposed by the second openings may be soaked using a sodium hydroxide solution with a mass concentration of 1% to 5% for a duration of 400s to 800s.

In some embodiments, the portions of the initial first doped section 31 may also be removed to form the first openings 40 by either hydrogen fluoride-containing slurry etching or mechanical etching.

Referring to FIG. 1 and FIG. 3, a plurality of second doped sections 102 are formed on the first side. The second doped section 102 has a conductivity type different from a conductivity type of the first doped section 101. Each second doped section 102 includes a third portion 121 extending along the second direction Y and a plurality of fourth portions 122 distributed at intervals along the second direction Y. Each fourth portion 122 extends along the first direction X, and is intersected with the third portion 121. First portions 111 and third portions 121 are alternatingly arranged the first direction X. A first portion 111 disposed on an outermost side is arranged at the first edge 10. In a first doped section 101 and a second doped section 102 adjacent to each other, second portions 112 and fourth portions 122 are alternatingly arranged along the second direction Y. In each first doped section 101, two second portions 112 that are disposed on the outermost side are respectively arranged on the two second edges 20.

Figure 15:
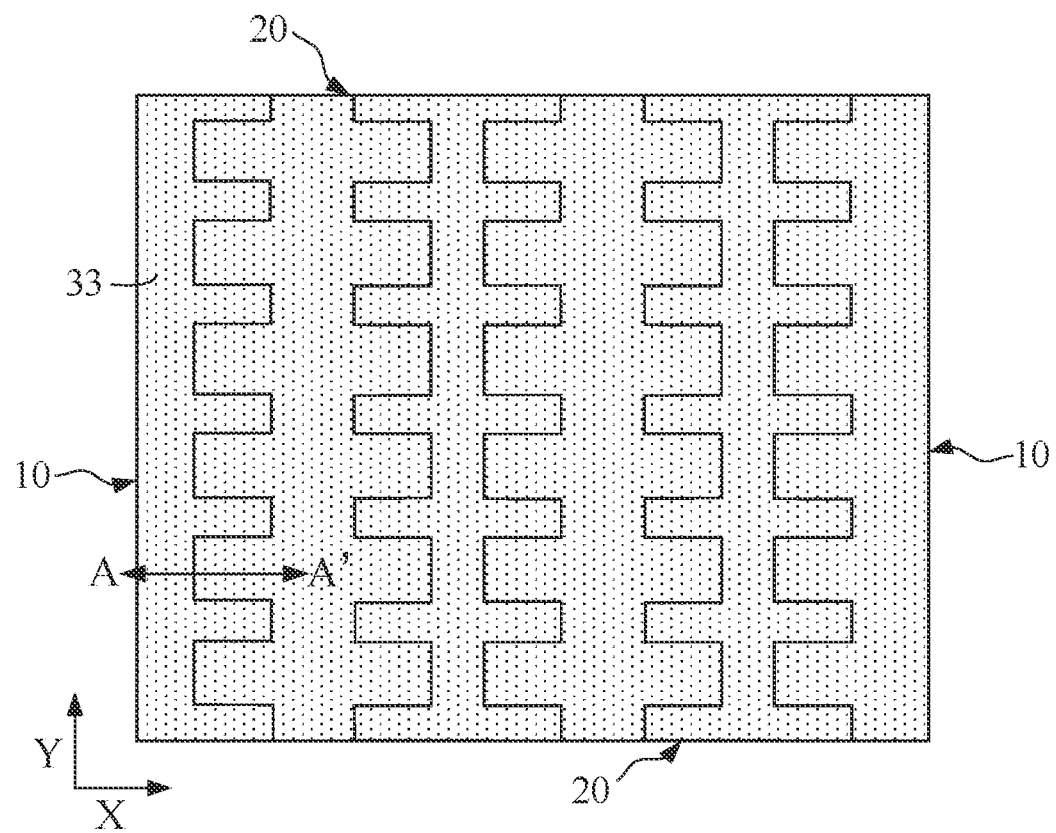
FIG. 15 is a schematic top view corresponding to operations of forming an initial second doped section in a method for preparing a back-contact solar cell according to some embodiments of the present disclosure.
Figure 16:
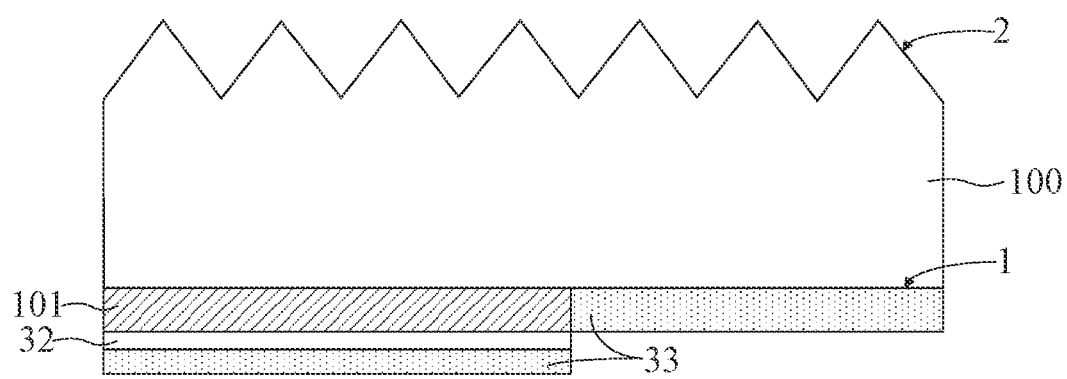
FIG. 16 is a schematic sectional view corresponding to operations of forming an initial second doped section in a method for preparing a back-contact solar cell according to some embodiments of the present disclosure.

FIG. 15 is a schematic top view corresponding to operations of forming an initial second doping region in a method for preparing a back-contact solar cell according to some embodiments of the present disclosure. FIG. 16 is a schematic sectional view (taken along an AA' direction in FIG. 15) corresponding to operations of forming an initial second doped section in a method for preparing a back-contact solar cell according to some embodiments of the present disclosure.

In some embodiments, in the doping process, a first glass layer 32 is also formed over a surface of the initial first doped section 31, and after the first patterning process, a portion of the first glass layer 32 over the surface of the first doped section 101 is reserved; and operations of forming the plurality of second doped sections 102 include: forming an initial second doped section 33 filling the first openings 40, where the initial second doped section 33 is doped with a third doping element having a conductivity type different from a conductivity type of the second doping element, referring to FIG. 15 and FIG. 16. In a specific example, the second doping element is a P-type doping element, and then the third doping element may be a phosphorus element.

In some embodiments, a material of the initial second doped section 33 may include polysilicon. The polysilicon may be formed in the first openings 40 by a deposition process and subjected to a phosphorus diffusion process to form the initial second doped section 33.

Since the first glass layer 32 is formed over the surface of the first doped section 101, the first glass layer 32 serves as a mask to prevent the initial second doped section 33 from being in direct contact with the first doped sections 101 in the process of forming an initial second doped layer, and therefore the initial second doped section 33 is also formed over the surface of the first glass layer 32 in the process of forming the initial second doped section 33.

Figure 17:
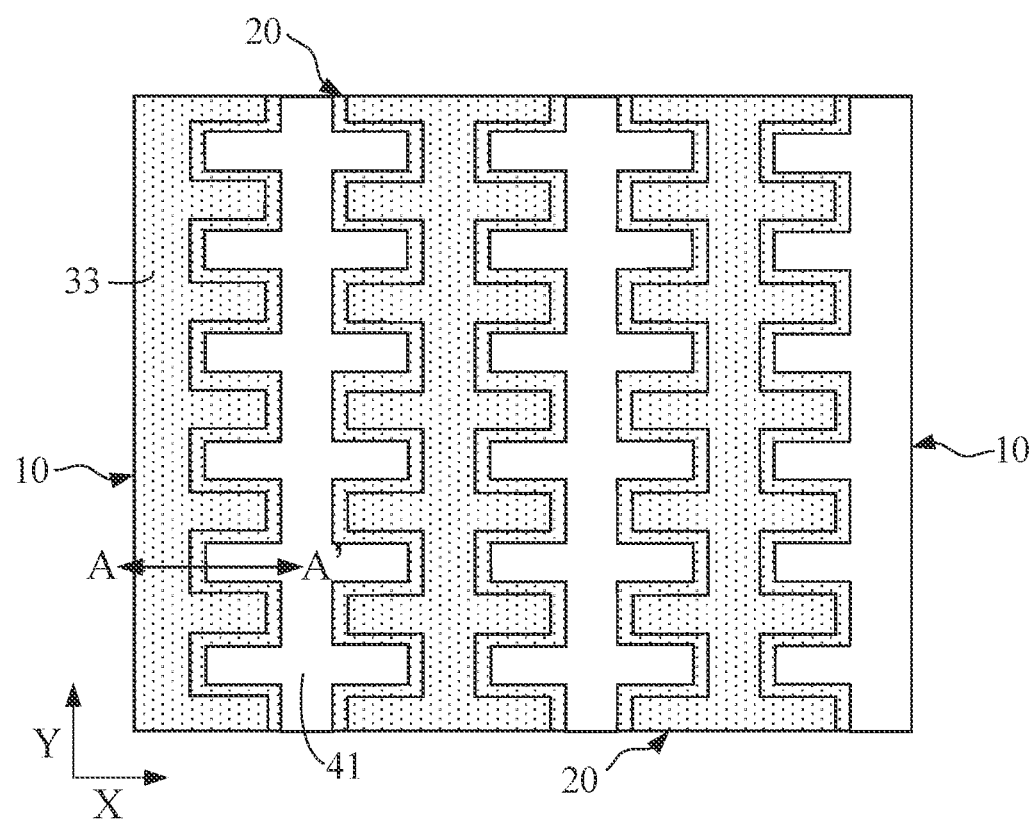
FIG. 17 is a schematic top view corresponding to operations of forming a mask layer in a method for preparing a back-contact solar cell according to some embodiments of the present disclosure.
Figure 18:
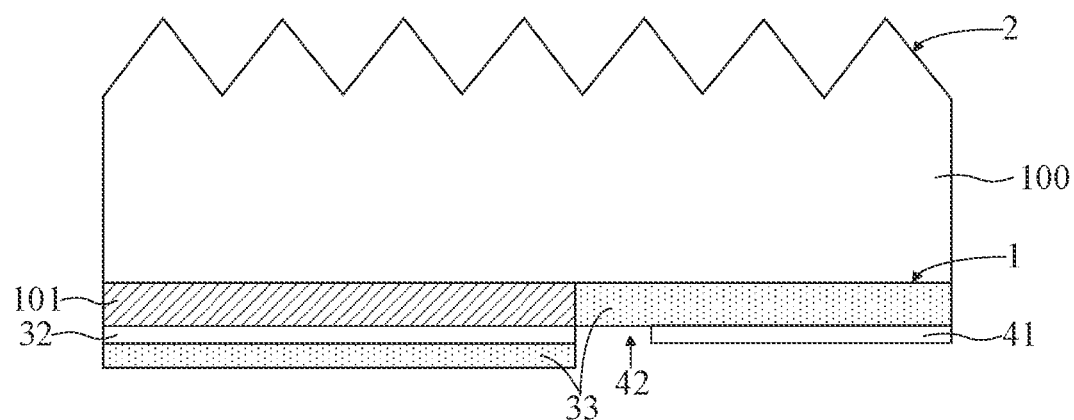
FIG. 18 is a schematic sectional view corresponding to operations of forming a mask layer in a method for preparing a back-contact solar cell according to some embodiments of the present disclosure.

FIG. 17 is a schematic top view corresponding to operations of forming a mask layer in a method for preparing a back-contact solar cell according to some embodiments of the present disclosure. FIG. 18 is a schematic sectional view (taken along an AA' direction in FIG. 17) corresponding to operations of forming a mask layer in a method for preparing a back-contact solar cell according to some embodiments of the present disclosure.

Referring to FIG. 17 and FIG. 18, a mask layer 41 is formed on a surface of a portion, in contact with the first surface 1, of the initial second doped section 33. The mask layer 41 has second openings 42 exposing portions of the initial second doped section 33. The shape of the mask layer 41 is the same as the shape of the second doped sections 102 to be formed. The second opening 42 may be adjacent to the first doped section 101, so that upon subsequent etching of the initial second doped section 33 along the second openings 42, a gap is formed between the first doped section 101 and the second doped section 102 to isolate the first doped section 101 from the second doped section 102.

In some embodiments, the mask layer 41 may be an ink layer. The ink layer may be formed on the surface of the initial second doped section 33 by a printing process.

Due to the low accuracy of the printing process at the edge of the first surface 1, a surface of a portion, which needs to be covered by the mask layer 41, of the initial second doped section 33 at the edge is not covered by the mask layer 41. As a result, the portion of the initial second doped section 33, which needs to be reserved, is removed in the subsequent operation, resulting in poor continuity of the pattern of the formed second doped section at the edge is poor. Consequently, a large recombination loss at the edge may be caused, and hence the recombination rate of carriers at the edge is high, which is inconducive to improving the performance of the back contact solar cell.

In view of the above-mentioned problem, in the embodiments of the present disclosure, the two second edges 20 and at least one first edges 10 of the first surface 1 all include first doped sections 101, so that there are fewer second doped sections 102 at the edges of the first surface 1. In this way, the problem of low film layer continuity of the second doped section 102 formed at the edge due to a low alignment accuracy of the mask 41 for the second doped section 102 at the edge can be improved, and meanwhile the problem of increased recombination loss at the edge can also be improved.

Referring to FIGS. 1 to 3, after forming the mask layer 41, an initial second doped section 33 (referring to FIG. 18) is etched along the second openings 42 (referring to FIG. 18) using the first glass layer 32 (referring to FIG. 18) and the mask layer 41 (referring to FIG. 18) as a mask, to expose portions of the substrate 100 aligned with the second openings 42, and remaining portions of the initial second doped section 33 form the second doped sections 102. The second opening 42 may be adjacent to the first doped section 101, so that upon subsequent etching of the initial second doped section 33 along the second opening 42, a gap is formed between the first doped section 101 and the second doped section 102 to isolate the first doped section 101 from the second doped section 102.

In the operations of etching the initial second doped section 33 along the second opening 42, portions of the initial second doped section 33 on the surface of the first glass layer 32 are also etched, and remaining portions of the initial second doped section 33 serves as the second doped sections 102.

The first glass layer 32 on the surface of the first doped section 101 is removed after the second doped section 102 is formed. In some embodiments, the first glass layer 32 may be cleaned with a hydrofluoric acid solution to remove the first glass layer 32.

In some embodiments, after forming the first doped sections 101 and the second doped sections 102, the method further includes: forming isolation structures 103, a respective isolation structure 103 be in the gap between a respective first doped section 101 and a respective second doped section 102 to isolate the respective first doped section 101 from the respective second doped section 102. In some embodiments, a material of the isolation structure 103 may include an insulating material, such as silicon oxide or silicon nitride.

Referring to FIG. 6, in some embodiments, the method further includes: forming a first passivation layer 104. The first passivation layer 104 covers surfaces of the first doped sections 101 and surfaces of the second doped sections 102. The first passivation layer 104 also fills the gap between the respective first doped section 101 and the respective second doped section 102.

Specifically, the first passivation layer 104 may fill the gap between the first doped section 101 and the second doped section 102, and cover a surface of the substrate 100 between the first doped section 101 and the second doped section 102. A portion of the first passivation layer 104 filling the gap between the first doped section 101 and the second doped section 102 may serve as the isolation structure 103. On one hand, the first passivation layer 104 can have a good passivation effect on the surface of the substrate 100, reduce the density of defect states on the surface of the substrate 100, better inhibit recombination of carriers in the surface of the substrate 100, and achieve an anti-reflection effect. On the other hand, the first passivation layer 104 can also isolate the first doped section 101 from the second doped section 102.

With first passivation layer 104, both a passivation effect and an effect of the isolation structure 103 are achieved, so that the additional operation of forming the isolation structure 103 can be eliminated, simplifying the process flow.

In some embodiments, the first passivation layer 104 may has a single-layered structure, and in other embodiments, the first passivation layer 104 may also has a multi-layered structure. In some embodiments, a material of the first passivation layer 104 includes at least one of silicon oxide, aluminum oxide, silicon nitride, or silicon oxynitride.

In some embodiments, operations of forming the first passivation layer 104 may include: forming a first passivation layer 104 on surfaces, away from the substrate 100, of the respective first doped section 101 and the respective second doped section 102, and the gap between the respective first doped section 101 and the respective second doped section 102 by using a plasma enhanced chemical vapor deposition (PECVD) method.

In some embodiments, an isolator material may also be filled in the gap between the first doped section 101 and the second doped section 102 to form an isolation structure 103. The first passivation layer 104 may cover the surface of the first doped section 101, the surface of the second doped section 102, and the surface of the isolation structure 103.

Referring to FIG. 8, in some embodiments, after forming the first passivation layer 104, the method further includes: forming first grids 105 and second grids 106.

Each first grids 105 includes a first busbar 131 and a plurality of first fingers 132 distributed at intervals along the second direction X. The first busbar 131 extends along the second direction Y. An orthographic projection of the first busbar 131 on the first surface 1 is in a surface of a corresponding first portion 111, and an orthographic projection of each first finger 132 on the first surface 1 is in a surface of a corresponding second portion 112. Each of second grid 106 include a second busbar 141 and a plurality of second fingers 142 distributed at intervals along the second direction Y. The second busbar 141 extends along the second direction Y. An orthographic projection of the second busbar 141 on the first surface is in a surface of a corresponding third portion 121, and an orthographic projection of each second finger 142 on the first surface 1 is in a surface of a corresponding fourth portion 122.

In some embodiments, the first grids 105 and the second grids 106 may be formed by a printing process and a sintering process.

Specifically, the first finger 132 may penetrate the first passivation layer 104 to be in electrical contact with the second portion 112, and the second finger 142 may penetrate the first passivation layer 104 to in electrical contact with the fourth portion 122. A conductive paste may be applied to surfaces of portions of the first passivation layer 104 aligned with the second portions 112 and the fourth portions 122 by a screen printing process, and after sintering, the conductive paste penetrates the first passivation layer 104 to in electric contact with the second portions 112 and the fourth portions 122.

The first busbar 131 and the second busbar 141 may be disposed over the surface of the first passivation layer 104. A conductive paste may be applied to on surfaces of portions of the first passivation layer 104 aligned with the first portion 111 and the third portion 121 by a screen printing process. The formed first busbar 131 is intersected with and electrically connected to the first fingers 132; and the formed second busbar 141 is intersected with and electrically connected to the second fingers 142.

It can be readily found that in the above method of forming the first doped section 101 and the second doped section 102, the first doped section 101 has a conductivity type different from a conductivity type of the substrate 100, and the second doped section 102 has a conductivity type same as a conductivity type of the substrate 100. In some embodiments, if the conductivity type of the first doped section 101 is the same as the conductivity type of the substrate 100 and the conductivity type of the second doped section 102 is different from the conductivity type of the substrate 100, the order of forming the first doped section 101 and forming the second doped section 102 may be reversed in the above method, with the remaining operations unchanged.

The technical solutions according to the embodiments of the present disclosure may achieve the following beneficial effects:

In the technical solutions of the back-contact solar cell according to the embodiments of the present disclosure, a plurality of first doped sections and a plurality of second doped sections are formed over the first surface, each first doped section includes a first portion, and each second doped section includes a third portion. The second doped section has a conductivity type different from a conductivity type of the first doped section. That is, the second doped section and the first doped section may respectively form a PN junction and a high-low junction with the substrate. The first portions and the third portions are alternatingly arranged along the first direction, and a first portion disposed on the outermost side is arranged at a first edge of the first surface. That is, a first portion is arranged at at least one first edge of the first surface.

Each first doped section further includes a plurality of second portions distributed at intervals along the second direction, and each second doped section further includes a plurality of fourth portions distributed at intervals along the second direction. In a first doped section and a second doped section adjacent to each other, second portions and fourth portions are alternatingly arranged, and in each first doped section, two second portions disposed on the outermost side are respectively arranged at two second edges of the first surface. Since the second portions and the fourth portions are alternatingly arranged, when two second portions disposed on the outermost side are arranged at the two second edges, no fourth portions are arranged at the two second edge. That is, second portions are disposed on the two second edges of the first surface.

The two second edges and at least one first edge of the first surface all include first doped sections, so that the edges of the first surface can be utilized to a greatest extent to arrange first doped sections and second doped sections as many as possible in the first surface, both the area proportion of the first doped sections and the area proportion of the second doped sections in the first surface can be improved, and hence both the area proportion of the PN junctions and the area proportion of the high-low junctions in the first surface are increased. In this way, the number of electron-hole pairs is increased, and the recombination rate of carriers at the interface of the substrate is reduced, comprehensively improving the photoelectric conversion efficiency of the back-contact solar cell.

The first doped sections have a larger area proportion in the first surface than the second doped sections. In the case where the first doped sections and the substrate form PN junctions, the area of the PN junctions in the first surface is increased, the built-in electric field is strengthened, meeting the functional requirement of the back-contact solar cell for increased number of electron-hole pairs, and improving the photoelectric conversion efficiency of the solar cell. In the case where the first doped sections and the substrate form high-low junctions, the recombination rate of carriers at the interface of the substrate is reduced, meeting the functional requirement of the back-contact solar cell for reduced recombination rate of carriers at the interface of the substrate. The conductivity type of the first doped section may be selected based on functional requirements of different back-contact solar cells to improve the photoelectric conversion performance of the corresponding back-contact solar cell.

Although the present disclosure is disclosed above with reference to the preferable embodiments, the embodiments are not intended to limit the present disclosure. Various variations and modifications may be made with departing from the spirit and scope of the present disclosure. Therefore, the protection scope of the present disclosure shall be subjected to the scope defined by the claims of the present disclosure.

Persons of ordinary skill in the art shall understand that the above embodiments are merely specific and exemplary embodiments for practicing the present disclosure, and in practice, various modifications may be made to these embodiments in terms of formality and detail, without departing from the spirit and scope of the present disclosure. Various variations and modifications may be made by one skilled in the art without departing from the spirit and scope of the present disclosure. Accordingly, the protection scope of the present disclosure is subject to the appended claims.

What is claimed is:

1. A back-contact solar cell, comprising:
a substrate, having a first side, the first side having two opposing first edges perpendicular to a first direction and two opposing second edges perpendicular a second direction, the first direction being perpendicular to the second direction; and
a doped layer, formed on the first side, wherein the doped layer includes:
a plurality of first doped sections, wherein each respective first doped section of the plurality of first doped sections includes a first portion extending along the second direction and a plurality of second portions distributed at intervals along the second direction, each of the plurality of second portions protruding from the first portion in a direction parallel to the second edges; and
a plurality of second doped sections, wherein each respective second doped section of the second doped sections includes a third portion extending along the second direction and a plurality of fourth portions distributed at intervals along the second direction, each of the fourth portions protruding from the third portion in the direction parallel to the second edges, the respective second doped section having a conductivity type different from a conductivity type of the respective first doped section, wherein the plurality of first doped sections and the plurality of second doped sections are alternatingly arranged in the first direction, and the plurality of first doped sections include an outermost first doped section having its first portion bordering one of the two first edges, another outermost first doped section having its first portion bordering the other one of the two first edges, and first doped sections having their first portions not bordering the two first edges between the two outermost first doped sections, each of a width of the first portion bordering the one of the two first edges and a width of the first portion bordering the other one of the two first edges being larger than a width of any of the first portions not bordering the two first edges;
wherein the plurality of second portions of the respective first doped section and fourth portions of a second doped section next to the respective first doped section are alternatingly arranged along the second direction;
wherein the plurality of second portions of the respective first doped section include an outermost second portion bordering one of the two second edges, another outermost second portion bordering the other one of the two second edges, and one or more other second portions between the two outermost second portions, wherein adjacent outermost second portions bordering the one of the two second edges are connected to each other, and adjacent outermost second portions bordering the other one of the two second edges are connected to each other; and
wherein each of the width of the first portion bordering the one of the two first edges and the width of the first portion bordering the other one of the two first edges differs by a first difference from the width of any of the first portions not bordering the two first edges, the first difference being 50 μm to 200 μm.

2. The back-contact solar cell according to claim 1, wherein each of a width of the outermost second portion bordering the one of the two second edges and a width of the another outermost second portion bordering the other one of the two second edges
differs by a second difference from a width of any of the one or more other second portions between the two outermost second portions.

3. The back-contact solar cell according to claim 2, wherein the second difference is less than or equals to 50 μm.

4. The back-contact solar cell according to claim 1, further comprising: isolation structures, wherein the plurality of first doped sections are spaced apart from the plurality of second doped sections, and a respective isolation structure of the isolation structures is abutted on one side by a respective first doped section of the plurality of first doped sections and on an opposing side by a respective second doped section of the plurality of second doped sections.

5. The back-contact solar cell according to claim 4, further comprising: a first passivation layer, formed over the doped layer, wherein the first passivation layer is further configured to fill a gap between the respective first doped section and the respective second doped section, and a portion of the first passivation layer filling the gap between the respective first doped section and the respective second doped section serves as the respective isolation structure.

6. The back-contact solar cell according to claim 1, further comprising:
a plurality of first grids, wherein each respective first grid of the plurality of first grids includes a first busbar extending along the second direction and a plurality of first fingers distributed at intervals along the second direction, an orthographic projection of the first busbar on the substrate being in a surface of the first portion, and an orthographic projection of a respective first finger of the plurality of first fingers on the substrate being in a surface of a respective second portion of the plurality of second portions; and a plurality of second grids, wherein each respective second grid of the plurality of second grids includes a second busbar extending along the second direction and a plurality of second fingers distributed at intervals along the second direction, an orthographic projection of the second busbar on the substrate being in a surface of the third portion, and an orthographic projection of a respective second finger of the plurality of second fingers on the substrate being in a surface of a respective fourth portion of the plurality of fourth portions.

7. The back-contact solar cell according to claim 6, wherein a width of the first portion is larger than a width of the first busbar, and a width of the third portion is larger than a width of the second busbar.

8. A photovoltaic module, comprising:
at least one cell string, each formed by connecting back-contact solar cells;
at least one encapsulation layer, each configured to cover a surface of the at least one cell string; and
at least one cover plate, each configured to cover a surface of the at least one encapsulation layer away from the at least one cell string,
wherein each of the back-contact solar cells includes:
a substrate, having a first side, the first side having two opposing first edges perpendicular to a first direction and two opposing second edges perpendicular a second direction, the first direction being perpendicular to the second direction; and
a doped layer, formed on the first side, wherein the doped layer includes:
a plurality of first doped sections, wherein each respective first doped section of the plurality of first doped sections includes a first portion extending along the second direction and a plurality of second portions distributed at intervals along the second direction, each of the plurality of second portions protruding from the first portion along the first direction; and
a plurality of second doped sections, wherein each respective second doped section of the second doped sections includes a third portion extending along the second direction and a plurality of fourth portions distributed at intervals along the second direction, each of the fourth portions protruding from the third portion along the first direction, the respective second doped section having a conductivity type different from a conductivity type of the respective first doped section,
wherein the plurality of first doped sections and the plurality of second doped sections are alternatingly arranged in the first direction, and the plurality of first doped sections include an outermost first doped section having its first portion bordering one of the two first edges, another outermost first doped section having its first portion bordering the other one of the two first edges, and first doped sections having their first portions not bordering the two first edges between the two outermost first doped sections, each of a width of the first portion bordering the one of the two first edges and a width of the first portion bordering the other one of the two first edges being larger than a width of any of the first portions not bordering the two first edges;
wherein the plurality of second portions of the respective first doped section and fourth portions of a second doped section next to the respective first doped section are alternatingly arranged along the second direction; and wherein the plurality of second portions of the respective first doped section include an outermost second portion bordering one of the two second edges, another outermost second portion bordering the other one of the two second edges, and one or more other second portions between the two outermost second portions, wherein adjacent outermost second portions bordering the one of the two second edges are connected to each other, and adjacent outermost second portions bordering the other one of the two second edges are connected to each other; and wherein each of the width of the first portion bordering the one of the two first edges and the width of the first portion bordering the other one of the two first edges differs by a first difference from the width of any of the first portions not bordering the two first edges, the first difference being 50 μm to 200 μm.

9. The back-contact solar cell according to claim 1, wherein the respective second doped section has the conductivity type same as a conductivity type of the substrate, and a doping element concentration larger than a doping element concentration of the substrate.

10. The back-contact solar cell according to claim 9, wherein the substrate is a P-type substrate, the respective first doped section is doped with an N-type doping element, and the respective second doped section is doped with a P-type doping element.

11. The back-contact solar cell according to claim 9, wherein the substrate is an N-type substrate, the respective first doped section is doped with a P-type doping element, and the respective second doped section is doped with an N-type doping element.

12. The back-contact solar cell according to claim 11, wherein the P-type doping element is any one of boron (B), aluminum (Al), gallium (Ga) or indium (In), and the N-type doping element is any one of potassium (P), bismuth (Bi), antimony (Sb) or arsenic (As).

13. The back-contact solar cell according to claim 1, wherein the respective first doped section has the conductivity type same as a conductivity type of the substrate, and a doping element concentration larger than a doping element concentration of the substrate.

14. The photovoltaic module according to claim 8, wherein the respective second doped section has the conductivity type same as a conductivity type of the substrate, and a doping element concentration larger than a doping element concentration of the substrate.

15. The photovoltaic module according to claim 8, wherein the respective first doped section has the conductivity type same as a conductivity type of the substrate, and a doping element concentration larger than a doping element concentration of the substrate.

16. The photovoltaic module according to claim 8, wherein each of a width of the outermost second portion bordering the one of the two second edges and a width of the another outermost second portion bordering the other one of the two second edges differs by a first second difference from a width of any of the one or more other second portions between the two outermost second portions.

17. The photovoltaic module according to claim 16, wherein the second difference is less than or equals to 50 μm.

18. The photovoltaic module according to claim 8, further comprising: isolation structures, wherein the plurality of first doped sections are spaced apart from the plurality of second doped sections, and a respective isolation structure of the isolation structures is abutted on one side by a respective first doped section of the plurality of first doped sections and on an opposing side by a respective second doped section of the plurality of second doped sections.

\* \* \* \* \*